US010436946B2

(12) United States Patent
Free et al.

(10) Patent No.: US 10,436,946 B2
(45) Date of Patent: Oct. 8, 2019

(54) LAMINATION TRANSFER FILMS FOR FORMING ANTIREFLECTIVE STRUCTURES

(71) Applicant: 3M INNOVATIVE PROPERTIES COMPANY, St. Paul, MN (US)

(72) Inventors: Michael Benton Free, Baytown, MN (US); Justin P. Meyer, Oakdale, MN (US); Olester Benson, Jr., Woodbury, MN (US); Terry O. Collier, Woodbury, MN (US); Mieczyslaw H. Mazurek, Roseville, MN (US); Martin B. Wolk, Woodbury, MN (US); Moses M. David, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/493,871

(22) Filed: Apr. 21, 2017

(65) Prior Publication Data
US 2017/0227682 A1    Aug. 10, 2017

Related U.S. Application Data

(62) Division of application No. 15/084,025, filed on Mar. 29, 2016, which is a division of application No. 14/159,253, filed on Jan. 20, 2014.

(51) Int. Cl.
*G02B 1/118* (2015.01)
*B32B 37/00* (2006.01)
*B32B 38/10* (2006.01)
*C03C 17/30* (2006.01)
*G02B 1/02* (2006.01)
(Continued)

(52) U.S. Cl.
CPC ............ *G02B 1/118* (2013.01); *B32B 37/025* (2013.01); *B32B 38/10* (2013.01); *C03C 17/28* (2013.01); *C03C 17/30* (2013.01); *C23C 16/0236* (2013.01); *C23C 16/50* (2013.01); *G02B 1/02* (2013.01); *B32B 2037/243* (2013.01); *B32B 2307/40* (2013.01); *B32B 2551/00* (2013.01); *C03C 2217/732* (2013.01);
(Continued)

(58) Field of Classification Search
None
See application file for complete search history.

(56) References Cited

U.S. PATENT DOCUMENTS

RE24,906 E    12/1960  Ulrich
5,039,561 A    8/1991  Debe
(Continued)

FOREIGN PATENT DOCUMENTS

EP    2275842    1/2011
JP    2011-068004    4/2011
(Continued)

OTHER PUBLICATIONS

Bhushan, "Biomimetics: lessons from nature—an overview," Philosophical Transactions of the Royal Society A, 2009; vol. 367, pp. 1445-1486.
(Continued)

Primary Examiner — Andres Munoz
(74) Attorney, Agent, or Firm — Jonathan L. Tolstedt

(57) ABSTRACT

Transfer films, articles made therewith, and methods of making and using transfer films that include antireflective structures are disclosed.

13 Claims, 11 Drawing Sheets

(51) Int. Cl.
*C23C 16/02* (2006.01)
*C23C 16/50* (2006.01)
*C03C 17/28* (2006.01)
*B32B 37/24* (2006.01)

(52) U.S. Cl.
CPC ......... *C03C 2217/77* (2013.01); *Y10T 156/10* (2015.01); *Y10T 428/24355* (2015.01)

(56) References Cited

U.S. PATENT DOCUMENTS

| | | | |
|---|---|---|---|
| 5,453,104 | A | 9/1995 | Schwabel |
| 5,491,015 | A | 2/1996 | Reeves |
| 6,329,058 | B1 | 12/2001 | Arney |
| 6,376,590 | B2 | 4/2002 | Kolb |
| 6,396,079 | B1 | 5/2002 | Hayashi |
| 6,521,324 | B1 | 2/2003 | Debe |
| 6,849,558 | B2 | 2/2005 | Schaper |
| 6,858,253 | B2 | 2/2005 | Williams |
| 7,241,437 | B2 | 7/2007 | Davidson |
| 7,384,809 | B2 | 6/2008 | Donofrio |
| 8,460,568 | B2 | 6/2013 | David |
| 8,499,810 | B2 | 8/2013 | Schaper |
| 9,472,788 | B2 * | 10/2016 | Collier .................. H01L 21/477 |
| 2005/0126766 | A1 | 6/2005 | Le |
| 2006/0270806 | A1 | 11/2006 | Hale |
| 2007/0042174 | A1 | 2/2007 | Rao |
| 2007/0116934 | A1 | 5/2007 | Miller |
| 2009/0015142 | A1 | 1/2009 | Potts |
| 2009/0098739 | A1 | 4/2009 | Ohnuma |
| 2009/0263668 | A1 | 10/2009 | David |
| 2009/0322219 | A1 | 12/2009 | Wolk |
| 2010/0006211 | A1 | 1/2010 | Wolk |
| 2010/0104807 | A1 | 4/2010 | Chiu |
| 2010/0151207 | A1 | 6/2010 | Hansen |
| 2010/0160577 | A1 | 6/2010 | Hirano |
| 2010/0239783 | A1 | 9/2010 | Mao |
| 2011/0182805 | A1 | 7/2011 | DeSimone |
| 2011/0281068 | A1 * | 11/2011 | David .................... G02B 1/118 428/141 |
| 2011/0305787 | A1 | 12/2011 | Ishii |
| 2012/0012557 | A1 * | 1/2012 | David ................ H01L 31/0236 216/71 |
| 2012/0099323 | A1 | 4/2012 | Thompson |
| 2012/0328829 | A1 | 12/2012 | Vang |
| 2013/0011608 | A1 | 1/2013 | Wolk |
| 2013/0038949 | A1 | 2/2013 | David |
| 2013/0344290 | A1 | 12/2013 | Yu |
| 2014/0004304 | A1 | 1/2014 | Yu |
| 2014/0021492 | A1 | 1/2014 | Wolk |
| 2014/0175707 | A1 | 6/2014 | Wolk |
| 2014/0178646 | A1 | 6/2014 | Wolk |
| 2014/0242343 | A1 | 8/2014 | Free |
| 2015/0158268 | A1 * | 6/2015 | Koike ...................... B32B 3/30 156/247 |
| 2016/0096316 | A1 | 4/2016 | Wolk |
| 2016/0104851 | A1 | 4/2016 | Wolk |

FOREIGN PATENT DOCUMENTS

| | | |
|---|---|---|
| WO | WO 2010/078071 | 7/2010 |
| WO | WO 2010-078306 | 7/2010 |
| WO | WO 2011-139593 | 11/2011 |
| WO | WO 2013-025614 | 2/2013 |
| WO | WO 2013-148031 | 10/2013 |
| WO | WO 2013/148129 | 10/2013 |
| WO | WO 2013/171284 | 11/2013 |
| WO | WO 2015/108773 | 7/2015 |

OTHER PUBLICATIONS

Bhushan., "Micro-, nano- and hierarchical structures for superhydrophobicity, self-cleaning and low adhesion," Philosophical Transactions of the Royal Society A, 2009, vol. 367, pp. 1631-1672.

Boden, "Bio-Mimetic Subwavelength Surfaces for Near-Zero Reflection Sunrise to Sunset," Photovoltaic Energy Conversion, Conference Record of the 2006 IEEE 4th World Conference, 2006, vol. 2; pp. 1358-1361.

Campos, "Superoleophobic Surfaces through Control of Sprayed-on Stochastic Topography," Langmuir, 2012, vol. 28, No. 25, pp. 9834-9841.

Chiniwalla, "Multilayer Planarization of Polymer Dielectrics," IEEE Transactions on Advanced Packaging, 2001, vol. 24, No. 1, pp. 41-53.

Gao, "Wetting 101," Langmuir, 2009; vol. 25, No. 24, pp. 14105-14115.

Kim, "Effects of the Substrate Pretreatments on the Leakage Current in the Low-Temperature Poly-Si TFTs," Materials Research Society Symposium Proceedings, 1997, vol. 448, pp. 419-423.

Kohdoh, "Surface treatment of sheet glass. Present status and future prospects," Journal of Non-Crystalline Solids, 1994, vol. 178, pp. 189-198.

Meuler, "Relationships between Water Wettability and Ice Adhesion," ACS Applied Materials and Interfaces, 2010; vol. 2, No. 11, pp. 3100-3110.

Mistler, "Tape Casting: Theory and Practice," American Ceramic Society, 2000, 3pgs.

Shaw, "Negative photoresists for optical lithography," IBM Journal of Research and Development, 1997; vol. 41, No. 1/2, pp. 81-94.

Xia, "Bio-Inspired, Smart, Multiscale Interfacial Materials," Advanced Materials, 2008, vol. 20, No. 15, pp. 2842-2858.

U.S. Appl. No. 14/159,300, "Lamination Transfer Films for Forming Articles with Engineered Voids," filed Jan. 20, 2014.

\* cited by examiner

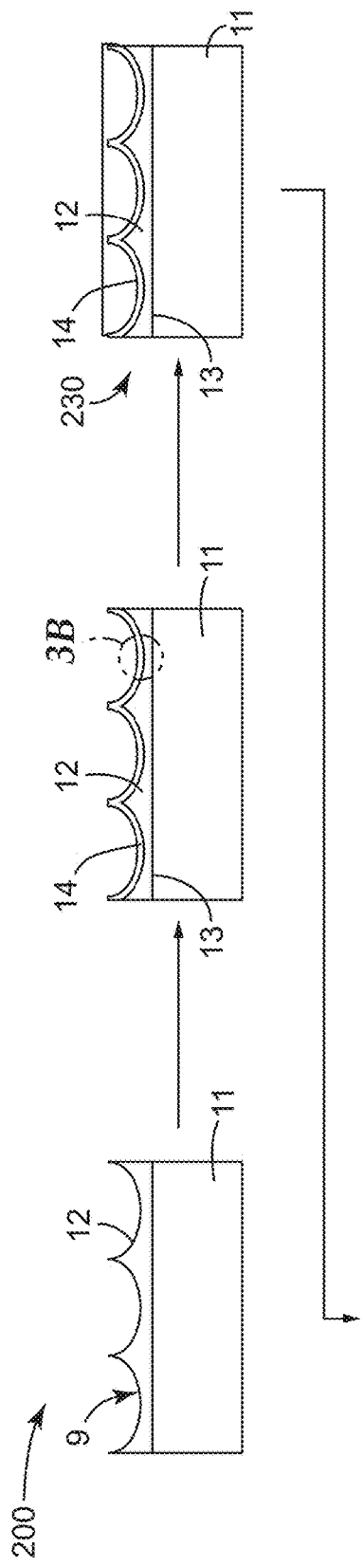
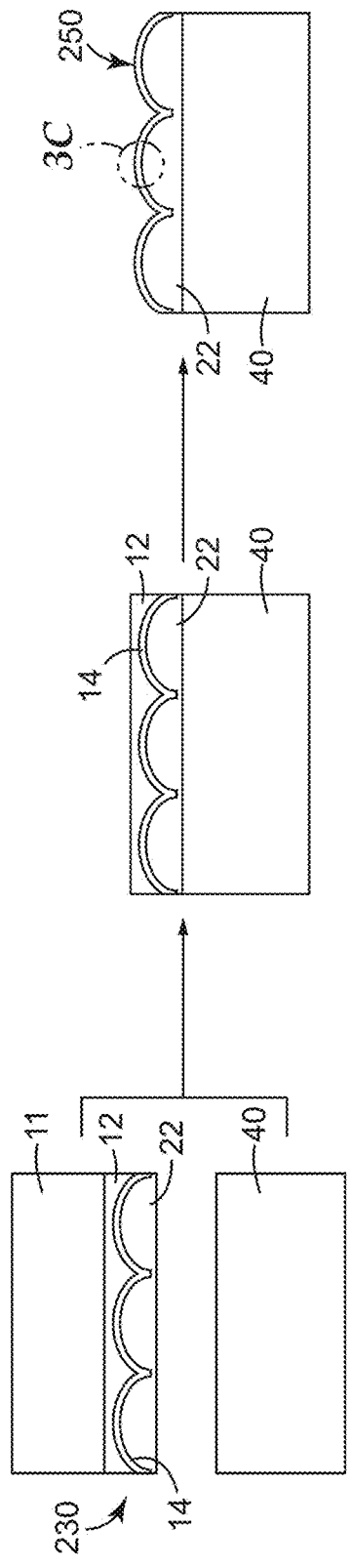
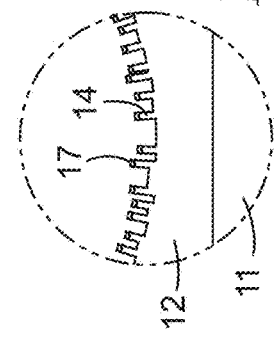
FIG. 3A
FIG. 3B
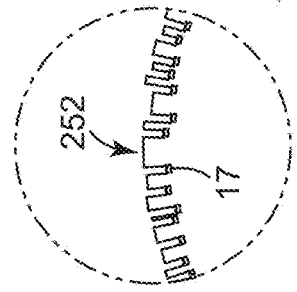
FIG. 3C

600nm

600nm

600nm

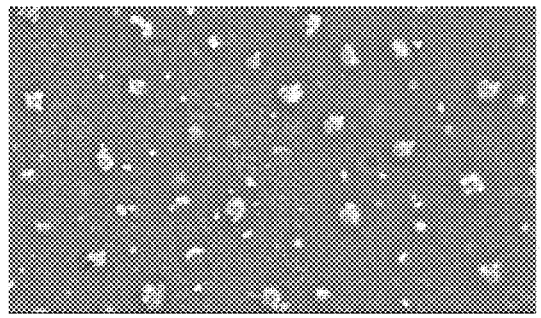 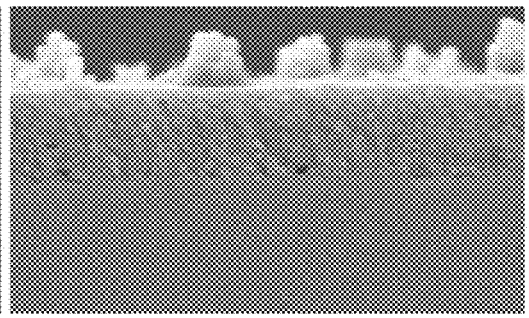
FIG. 10A-1　　　　　　　FIG. 10A-2
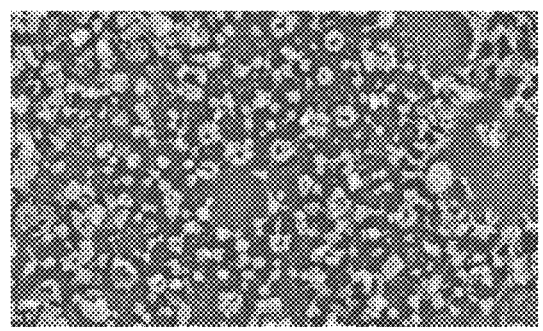 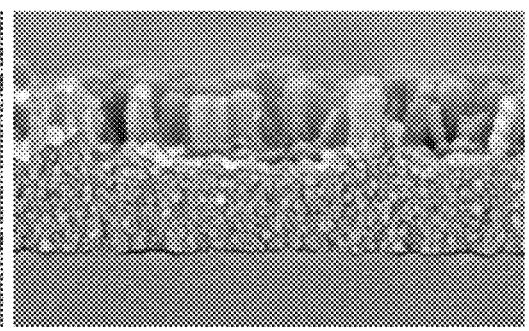
FIG. 10B-1　　　　　　　FIG. 10B-2
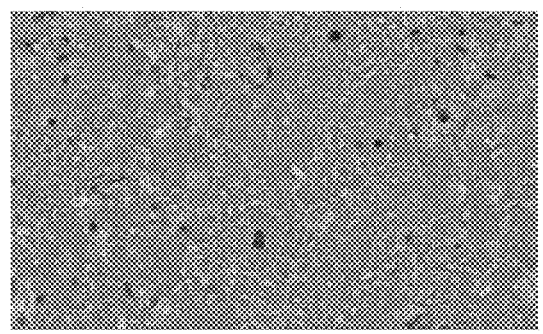 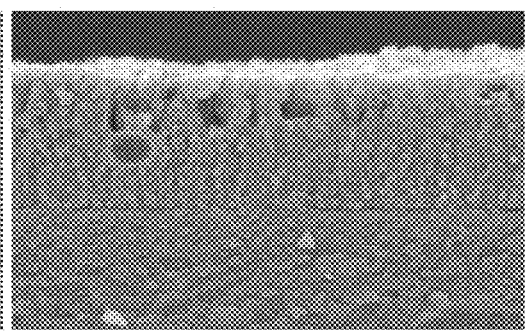
FIG. 10C-1　　　　　　　FIG. 10C-2

600nm

600nm

600nm

600nm

600nm

600nm

100nm 2.00μm

600nm

LAMINATION TRANSFER FILMS FOR FORMING ANTIREFLECTIVE STRUCTURES

BACKGROUND

Nanostructures and microstructures on glass substrates are used for a variety of applications in display, lighting, architecture and photovoltaic devices. In display devices the structures can be used for light extraction or light distribution. In lighting devices the structures can be used for light extraction, light distribution, and decorative effects. In photovoltaic devices the structures can be used for solar concentration and antireflection. Patterning or otherwise forming nanostructures and microstructures on large glass substrates can be difficult and cost-ineffective.

SUMMARY

The present disclosure relates to lamination transfer films for forming articles with antireflective structures and method of forming these lamination transfer films.

In one aspect, a transfer film includes a carrier film, a sacrificial template layer disposed on the carrier film and having antireflective nanostructure template features, and a thermally stable backfill layer having a first surface conforming to the antireflective nanostructure template features and an opposing planar second surface.

In another aspect, a method includes laminating the planar second surface of the transfer film described herein to a receptor substrate and baking out the sacrificial template layer to form a thermally stable backfill layer having antireflective nanostructure features.

In another aspect, a method of forming a transfer film includes reactive ion etching a layer of sacrificial material to form antireflective nanostructure template features and coating a thermally stable backfill material on the antireflective nanostructure template features, forming a thermally stable backfill layer having a first surface conforming to the antireflective nanostructure template features and an opposing planar second surface. The method forming a lamination transfer film.

In another aspect, a method of forming a transfer film includes depositing sacrificial material template layer having antireflective nanowhisker template features on a release surface of a carrier film and coating a thermally stable backfill material on the antireflective nanowhisker template features to form a thermally stable backfill layer having a first surface conforming to the antireflective nanowhisker template features and an opposing planar second surface. The method forming a lamination transfer film.

In a further aspect, an optical article includes a layer of sapphire material and a thermally stable backfill layer having antireflective nanostructure features fixed to the layer of sapphire material.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 3A is a schematic process flow diagram of an illustrative sputter/etch method of forming a hierarchical structured transfer film and resulting final AR structure;

FIG. 3B is an enlargement of the reentrant template structure with hierarchical structure of FIG. 3A;

FIG. 3C is an enlargement of the reentrant structure with hierarchical structure of FIG. 3A;

FIG. 10A-1 illustrates a top view on the left and FIG. 10A-2 illustrates a side view on the right of baked out AR nanostructures for sample 2;

FIG. 10B-1 illustrates a top view on the left and FIG. 10B-2 illustrates a side view on the right of baked out AR nanostructures for sample 7;

FIG. 10C-1 illustrates a top view on the left and FIG. 10C-2 illustrates a side view on the right of baked out AR nanostructures for sample 15;

DETAILED DESCRIPTION

Figure 1:
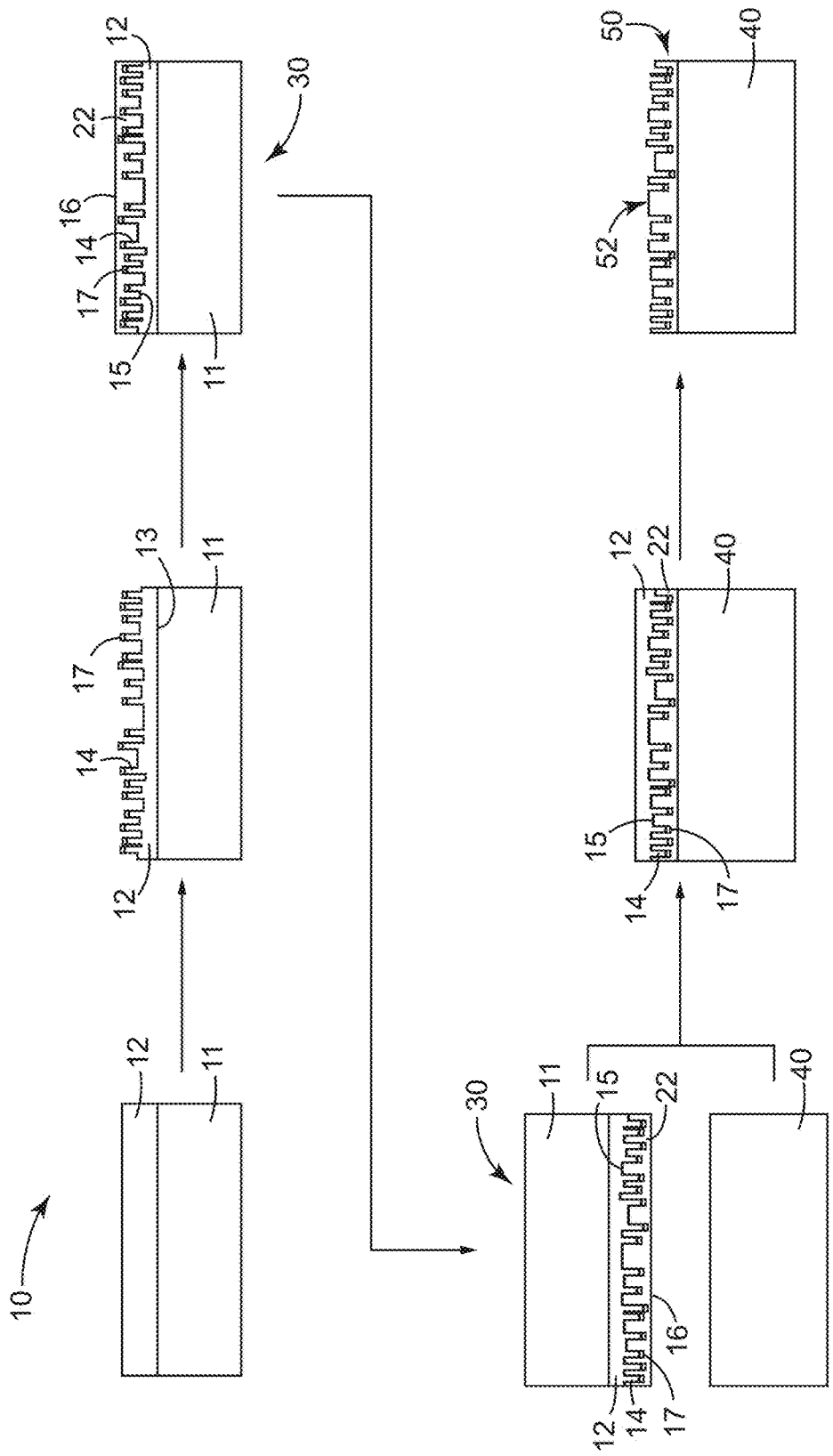
FIG. 1 is a schematic process flow diagram of an illustrative sputter/etch method of forming the transfer film and resulting final antireflective (AR) structure.

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g., 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

In this disclosure:

"backfill materials" or "backfill layers" refers to layers of materials that fill in irregular or structured surfaces to produce a new surface that may be used as a base to build additional layered elements and is thermally stable;

"bake-out" refers to the process of substantially removing sacrificial material present in a layer by pyrolysis, combustion, sublimation, or vaporization while leaving thermally stable materials substantially intact (backfill, substrate);

"bake-out temperature" refers to the maximum temperature reached during the process of substantially removing sacrificial materials in a layer by pyrolysis or combustion while leaving thermally stable materials substantially intact (backfill, substrate);

"combust" or "combustion" refers to a process of heating a layer that comprises organic materials in an oxidizing atmosphere so that organic materials undergo a chemical reaction with the oxidant;

"nanostructures" refers to features that range from about 1 nm to about 2000 nm in their longest dimension and includes microstructures;

"pyrolyze" or "pyrolysis" refers to a process of heating a sacrificial layer in an inert atmosphere so that organic materials in the article decompose;

"structured surface" refers to a surface that includes periodic, quasi-periodic or random engineered microstructures, nanostructures, and/or hierarchical structures that can be in a regular pattern or random across the surface;

"thermally stable" refers to materials that remain substantially intact during the removal of sacrificial materials;

"polysiloxanes" refers to highly branched oligomeric or polymeric organosilicon compounds and may include carbon-carbon and/or carbon-hydrogen bonds while still being considered as inorganic compounds;

"anisotropic" refers to having a height to width (that is, average width) ratio of about 1.5:1 or greater (preferably, 2:1 or greater, or 5:1 or greater).

The present disclosure relates to lamination transfer films for forming articles with antireflective structures and method of forming these lamination transfer films. These transfer films can be laminated to a desired substrate (like glass) and "baked out" to reveal unique antireflective structures. The antireflective nanostructured articles made by the methods described herein can exhibit one or more desirable properties such as antireflective properties, light absorbing properties, antifogging properties, improved adhesion, durability, hydrophobic and hydrophilic properties. For example, in some embodiments, the surface reflectivity of the nanostructured anisotropic surface is about 75%, preferable about 50%, or more preferably about 25% of the surface reflectivity of an untreated surface. The antireflective structures can be from template antireflective structures created by either reactive ion etching or nanowhisker deposition (using perylene red), for example. A thermally stable backfill material conforms to the template antireflective structures and remains on a receptor substrate following bake out of the sacrificial template antireflective structures. These thermally stable antireflective structures provided by the transfer films can create filmless broadband antireflection structures on receptor substrates such as glass and sapphire surfaces. Hierarchical structured surfaces can be formed that utilize the antireflective structures. While the present disclosure is not so limited, an appreciation of various aspects of the disclosure will be gained through a discussion of the examples provided below.

As used herein with respect to comparison of surface properties, the term "untreated surface" means the surface of an article comprising the same material (as the nanostructured surface of the disclosure to which it is being compared) but without a nanostructured anisotropic surface. In some embodiments, the percent reflection of the nanostructured anisotropic surface can be less than about 2% (typically, less than about 1%) as measured using the "Measurement of Average % Reflection" method described below. Likewise, in some embodiments, the percent transmission of the nanostructured anisotropic surface can be about 2% or more than the percent transmission of an untreated surface as measured using the "Measurement of Average % Transmission" method described below.

FIG. 1 is a schematic process flow diagram 10 of an illustrative sputter/etch method of forming the transfer film 30 and resulting final antireflective (AR) structure 50. This method includes forming a transfer film 30 by reactive ion etching a layer of sacrificial material 12 to form antireflective nanostructure template features 14 and coating a thermally stable backfill material 22 on the antireflective nanostructure template features 14, forming a thermally stable backfill layer 22 having a first surface 15 conforming to the antireflective nanostructure template features 14 and an opposing planar second surface 16, and forming a lamination transfer film 30.

The thermally stable backfill solution can be coated onto the antireflective nanostructure template features 14 and any solvent or portion of solvent removed and optionally cured to form the thermally stable backfill layer 22. Preferably, after removal of solvent and curing, the thermally stable material substantially planarizes the sacrificial template layer. Substantial planarization means that the amount of planarization (P %), as defined by Equation 1, is greater than 50%, or greater than 75%, or preferably greater than 90%.

$$P\% = (1-(t_1/h_1))*100 \tag{1}$$

where $t_1$ is the relief height of a surface layer and $h_1$ is the feature height of features covered by the surface layer, as further disclosed in P. Chiniwalla, *IEEE Trans. Adv. Packaging* 24(1), 2001, 41.

The sacrificial template layer 12 can be on a carrier layer 11 (i.e., liner) having a releasable surface. In other embodiments, a carrier layer 11 is not present. The liner or carrier layer 11 can be implemented with a thermally stable flexible film providing mechanical support for the other layers. The liner 11 has a releasable surface, meaning the liner 11 allows for release of a material applied to the releasable surface. The carrier layer 11 should be thermally stable above 70° C., or alternatively above 120° C., without adversely affecting either the sacrificial layer or the backfill layer. One example of a carrier film is polyethylene terephthalate (PET).

The support substrate or carrier layer (described herein) can be embodied as a flexible film providing mechanical support for the other layers. One example of a carrier film is polyethylene terephthalate (PET). Various polymeric film substrates comprised of various thermosetting or thermoplastic polymers are suitable for use as the support substrate. The carrier may be a single layer or multi-layer film. Illustrative examples of polymers that may be employed as the carrier layer film include (1) fluorinated polymers such as poly(chlorotrifluoroethylene), poly(tetrafluoroethylene-cohexafluoropropylene), poly(tetrafluoroethylene-co-perfluoro(alkyl)vinylether), poly(vinylidene fluoride-co-hexafluoropropylene); (2) ionomeric ethylene copolymers poly(ethylene-co-methacrylic acid) with sodium or zinc ions such as SURLYN-8920 Brand and SURLYN-9910 Brand available from E. I. duPont Nemours, Wilmington, Del.; (3) low density polyethylenes such as low density polyethylene; linear low density polyethylene; and very low density polyethylene; plasticized vinyl halide polymers such as plasticized poly(vinylchloride); (4) polyethylene copolymers including acid functional polymers such as poly(ethylene-co-acrylic acid) "EAA", poly(ethylene-co-methacrylic acid) "EMA", poly(ethylene-co-maleic acid), and poly(ethylene-co-fumaric acid); acrylic functional polymers such as poly(ethylene-co-alkylacrylates) where the alkyl group is methyl, ethyl, propyl, butyl, et cetera, or CH3 (CH2)n- where n is 0 to 12, and poly(ethylene-co-vinylacetate) "EVA"; and (5) aliphatic polyurethanes. The carrier layer can be an olefinic polymeric material, typically comprising at least 50 wt % of an alkylene having 2 to 8 carbon atoms with ethylene and propylene being most commonly employed. Other carrier layers include for example poly (ethylene naphthalate), polycarbonate, poly(meth)acrylate (e.g., polymethyl methacrylate or "PMMA"), polyolefins (e.g., polypropylene or "PP"), polyesters (e.g., polyethylene terephthalate or "PET"), polyamides, polyimides, phenolic resins, cellulose diacetate, cellulose triacetate (TAC), polystyrene, styrene-acrylonitrile copolymers, cyclic olefin copolymers, epoxies, and the like. In some embodiments, the carrier layer can include paper, release-coated paper, non-wovens, wovens (fabric), metal films, and metal foils. In some embodiments, the carrier layer can include sacrificial materials that can remain on the transfer film during the bake out process. For example, the carrier film can include a PET layer on a PMMA release layer where the release layer remains on the transfer film following release from the PET layer. Sacrificial materials (such as the PMMA release layer), can be pyrolyzed by subjecting them to thermal conditions that can vaporize substantially all of the organic material present in the sacrificial layers. These sacrificial layers can also be subjected to combustion to burn out all of the organic material present in the sacrificial layer. Typically, a clear, high-purity polymer, such as poly(methyl methacrylate), poly(ethyl acrylate-co-methyl methacrylate), can be used as the sacrificial material. Useful sacrificial materials leave very low organic residuals (ash) after pyrolysis or combustion at the bake out temperature.

The antireflective nanostructure template features 14 are formed by a sputter/etch or reactive ion etching process described in one or more of: WO2013148031 entitled "NANOSTRUCTURED MATERIAL AND METHOD OF MAKING THE SAME"; WO201325614 entitled "NANO-STRUCTURED ARTICLES AND METHODS TO MAKE THE SAME"; US20130344290 entitled "NANOSTRUCTURED ARTICLES"; US20140004304 entitled "MULTI-LAYER NANOSTRUCTURED ARTICLES"; US20130038949 entitled "METHOD OF MAKING A NANOSTRUCTURE"; US20120328829 entitled "COMPOSITE WITH NANO-STRUCTURED LAYER"; US20110281068 entitled "NANOSTRUCTURED ARTICLES AND METHODS OF MAKING NANO-STRUCTURED ARTICLES"; US20120012557 entitled "METHOD FOR MAKING NANOSTRUCTURED SURFACES'; US20090263668 entitled "DURABLE COATING OF AN OLIGOMER AND METHODS OF APPLYING"; or US20100239783 entitled "METHODS OF FORMING MOLDS AND METHODS OF FORMING ARTICLES USING SAID MOLDS".

In many embodiments, the sputter/etch or reactive ion etching process includes applying a thin, random, discontinuous masking layer 17 to a major surface of the sacrificial template layer using plasma chemical vapor deposition. The major surface of the sacrificial template layer can be a planar surface or a microstructured surface. The random, discontinuous masking layer is the reaction product of plasma chemical vapor deposition using a reactant gas that can include a compound selected from organosilicon compounds, metal alkyls, metal isopropoxides, metal acetylacetonates and metal halides. In other embodiments the mask can be formed using surface nanoparticle mask, a bulk nanoparticle mask, a sputtered mask, or a simultaneous sputter/etch mask.

Plasma chemical vapor deposition (or plasma-enhanced chemical vapor deposition) is a process by which plasmas, typically generated by radio-frequency discharge, are formed in the space between two electrodes when that space is filled with a reacting gas or gases. Plasma chemical vapor deposition is done under vacuum to reduce side reactions from unwanted species being present in the reacting chamber. The reacting gas or gases typically deposit thin solid films on a substrate. In the provided method, a random, discontinuous masking layer is formed on the sacrificial template layer using plasma chemical vapor deposition. When small amounts of the product produced by plasma chemical vapor deposition initially deposit on the sacrificial template layer they tend to group together in small islands that are initially in a random, discontinuous pattern. In the provided method, reaction conditions are adjusted (web speed, plasma discharge energy, time of substrate exposure, etc.) so as to halt the deposition before any coalescence occurs. The masking layer thus deposited is random and discontinuous. In many embodiments the individual islands have average lateral dimensions of less than about 400 nm, less than about 200 nm, less than about 100 nm, less than about 50 nm or even less than about 20 nm.

This method includes etching portions of the major surface not protected by the masking layer 17 to form a nanostructure 14 on the sacrificial template layer 12. Typically, reactive ion etching is used for the etching. In one embodiment, the provided method can be carried out using a continuous roll-to-roll process referred to as "cylindrical reactive ion etching" (cylindrical RIE). Cylindrical RIE utilizes a rotating cylindrical electrode to provide anisotropically etched nanostructures on the surface of a substrate or article. In general, cylindrical RIE can be described as follows. A rotatable cylindrical electrode ("drum electrode") powered by radio-frequency (RF) and a grounded counter-electrode are provided inside a vacuum vessel. The counter-electrode can comprise the vacuum vessel itself. An etchant gas is fed into the vacuum vessel, and a plasma is ignited and sustained between the drum electrode and the grounded counter-electrode.

A continuous substrate including the sacrificial template layer and the optional carrier layer and having a random, discontinuous masking layer can then be wrapped around the circumference of the drum and the substrate can be etched in the direction normal to the plane of the substrate. The exposure time of the substrate can be controlled to obtain a predetermined etch depth of the resulting nanostructure. The process can be carried out at an operating pressure of approximately 10 mTorr. Cylindrical RIE is disclosed, for example, in PCT Pat. App. No. US/2009/069662 (David et al.).

The antireflective nanostructure template features 14 made by the sputter/etch or reactive ion etching process and the corresponding antireflective nanostructure features 52 of the thermally stable backfill layer 50 can have a nanostructured anisotropic surface. The antireflective nanostructure template features 14 can comprise nanoscale features having a height to width ratio of about 2:1 or greater; preferably about 5:1 or greater. In some embodiments, the height to width ratio can even be 50:1 or greater, 100:1 or greater, or 200:1 or greater. The antireflective nanostructure template features 14 can comprise nanofeatures such as, for example, nano-pillars or nano-columns, or continuous nano-walls comprising nano-pillars or nano-columns. Typically, the nanofeatures have steep side walls that are substantially perpendicular to the substrate. In some embodiments, the majority of the nanofeatures can be capped with mask material.

The antireflective nanostructure template features 14 are the inverse of the antireflective nanostructure features 52. For example, the height to width ratio of the antireflective nanostructure template peaks correspond to the height to width ratio of the antireflective nanostructure valleys.

In some embodiments the sacrificial template layer 12 includes the thermally stable molecular species and/or inorganic materials such as, for example, inorganic nanomaterials. The inorganic nanomaterials can be present in a sacrificial layer 12 and the sacrificial material can be cleanly baked out leaving a densified layer of nanomaterials. In some embodiments, the densified layer of nanomaterials can completely or partially fuse into a glass-like material. The densified layer of nanomaterials can have substantial void volume. The densified layer of nanomaterials can be transparent and can have a high index of refraction compared to surrounding layers of the disclosed transfer films. Inorganic nanoparticles can be present in one or more embedded layers, each layer having a different index of refraction influenced by the type and concentration of nanoparticles present in the layer.

The lamination transfer film 30 can be laminated to a receptor substrate 40 and exposed to a heating or baking out process to remove the sacrificial template layer 12 and to form antireflective nanostructure features 52 of the thermally stable backfill layer 50. In some embodiments, an optional sacrificial adhesive layer (not shown) is applied to the backfill layer 22 or to receptor substrate 40, prior to lamination.

Examples of receptor substrates 40 include glass such as display mother glass (e.g., backplane mother glass), display cover glass, lighting mother glass, architectural glass, roll glass, and flexible glass. An example of flexible roll glass is commercially available under the trade designation WILLOW glass from Corning Incorporated. Other examples of receptor substrates include metals such as metal parts, sheets and foils. Yet other examples of receptor substrates include sapphire, silicon, silica, and silicon carbide.

Display backplane mother glass receptor substrates can optionally include a buffer layer on a side of the receptor substrate to which a lamination transfer film is applied. Examples of buffer layers are described in U.S. Pat. No. 6,396,079, which is incorporated herein by reference as if fully set forth. One type of buffer layer is a thin layer of $SiO_2$, as described in K. Kondoh et al., J. of Non-Crystalline Solids 178 (1994) 189-98 and T-K. Kim et al., Mat. Res. Soc. Symp. Proc. Vol. 448 (1997) 419-23, both of which are incorporated herein by reference as if fully set forth.

A particular advantage of the transfer films and methods described herein is the ability to impart antireflective nanostructure features to receptor surfaces with large surfaces, such as display mother glass or architectural glass. Semiconductor patterning methods exist for creating nanopatterns that can be complex, however these methods are generally slow, complicated, expensive, and limited to the size of a single wafer (e.g., around 300 mm diameter). Step and repeat stamping methods such as nanoimprint lithography has been used to produce nanopatterns over larger areas than semiconductor patterning methods, however these methods are still generally slow, expensive, and complicated, often requiring several conventional photolithographic process steps such as resist coating, reactive ion etching, and resist stripping.

The transfer films and method described herein overcomes the above mentioned size constraints and complexity by utilizing roll-to-roll processing. The transfer films described herein have large enough dimensions to be used to impart nanostructures over, at least, entire large digital display substrates (e.g., a 55 inch diagonal AMOLED HDTV, with dimensions of 52 inches wide by 31.4 inches tall), for example.

The sacrificial template layer 12 can be cleanly baked out leaving antireflective nanostructure features 52 of the thermally stable backfill layer 50. FIG. 10A-C illustrate SEM micrographs of the antireflective nanostructure features 52 of the thermally stable backfill layer 50 formed by this process and described in Example 3 below. These figures illustrate that the sacrificial template layer 12 is capable of being baked out while leaving antireflective nanostructure features 52 of the thermally stable backfill layer 50.

Figure 2:
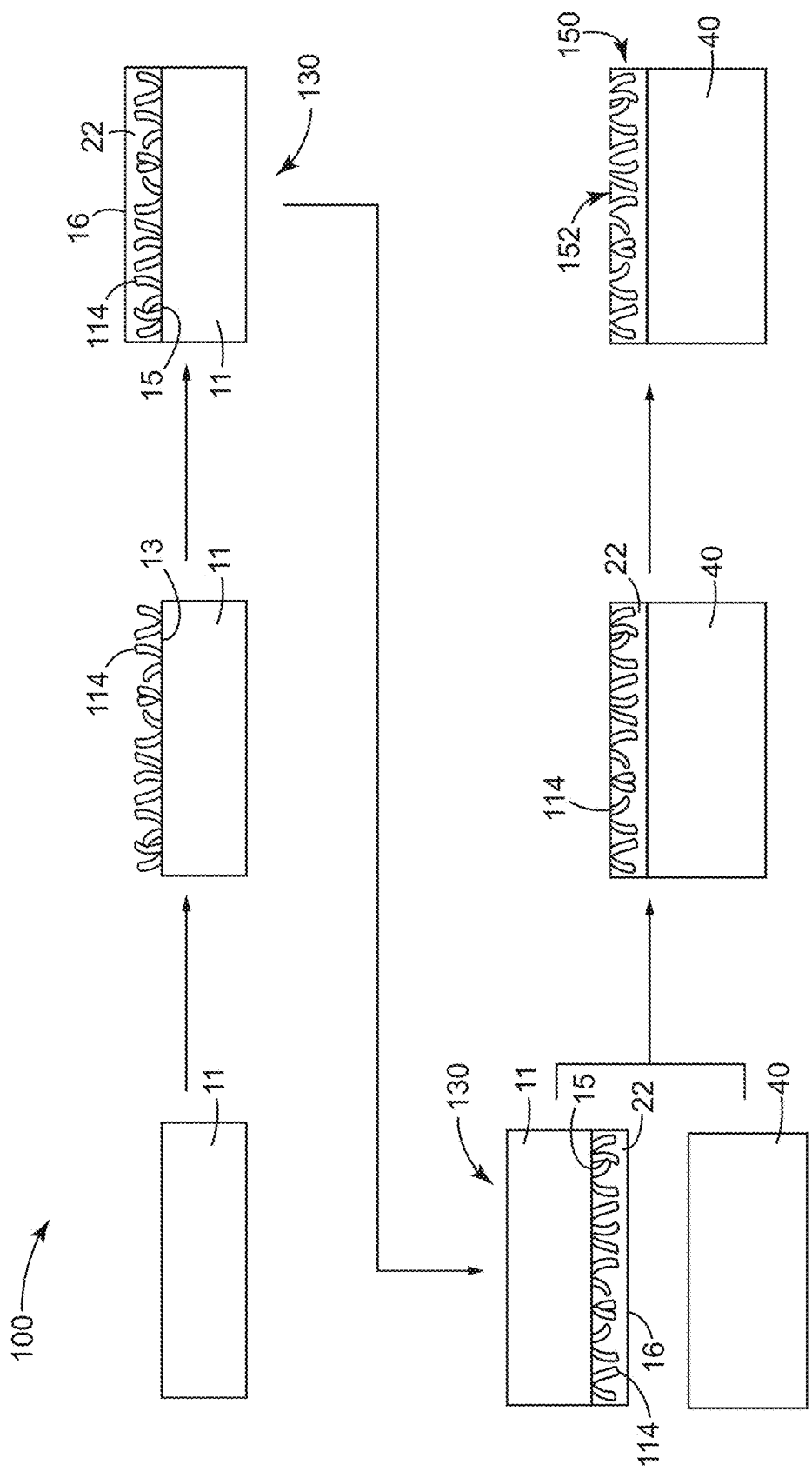
FIG. 2 is a schematic process flow diagram of an illustrative nanowhisker method of forming the transfer film and resulting final AR structure.

FIG. 2 is a schematic process flow diagram 100 of an illustrative nanowhisker method of forming the transfer film 130 and resulting final AR structure 152. This method includes forming a transfer film 130 by depositing sacrificial material template layer having antireflective nanowhisker template features 114 on a release surface 13 of a carrier film 11 (described above) and coating a thermally stable backfill material 22 on the antireflective nanowhisker template features 114 to form a thermally stable backfill layer 22 having a first surface 15 conforming to the antireflective nanowhisker template features 114 and an opposing planar second surface 16.

The thermally stable backfill solution can be coated onto the antireflective nanostructure sacrificial template features 114 and any solvent or portion of solvent removed and optionally cured to form the thermally stable backfill layer 22. Preferably, after removal of solvent and curing, the thermally stable material substantially planarizes the sacrificial template layer as described above.

Figure 4:
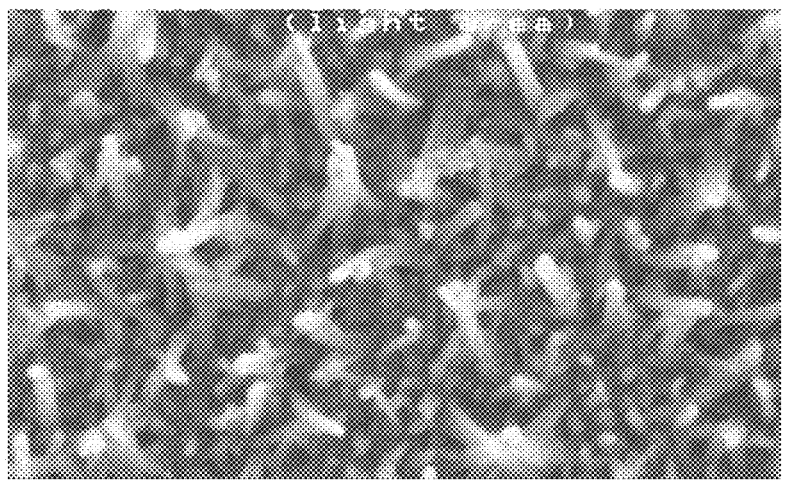
FIG. 4 is a top view SEM micrograph of a perylene whisker sacrificial film of Example 1.

The antireflective nanowhisker sacrificial template features 114 can be formed by any useful process and use materials as described in U.S. Pat. No. 5,039,561 entitled "METHOD FOR PREPARING AN ARTICLE HAVING SURFACE LAYER OF UNIFORMLY ORIENTTED, CRYSTALLINE, ORGANIC MICROSTRUCTURES". This references describes forming nanostructured anisotropic nanofeatures or nanowhiskers of the dye perylene red by vacuum deposition of a smooth layer of the dye followed by annealing to promote self-assembly of the dye molecules into whisker elements as illustrated in FIG. 4 and described in Example 1 below.

The lamination transfer film 130 can be laminated to a receptor substrate 40 (described above) and exposed to a heating or baking out process to remove the antireflective nanowhisker sacrificial template features 114 and to form antireflective nanostructure features 152 of the thermally stable backfill layer 150. In some embodiments, an optional sacrificial adhesive layer (not shown) is applied to the backfill layer 22 or to receptor substrate 40, prior to lamination.

Figure 5:
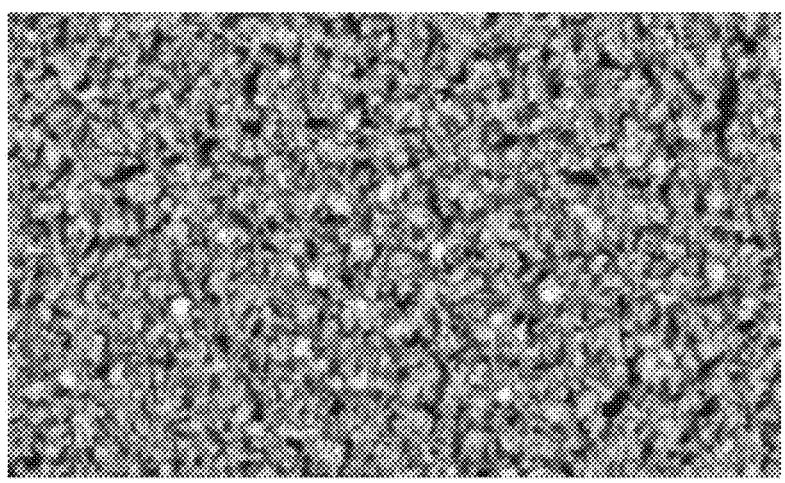
FIG. 5 is a top view SEM micrograph of the thermally stable perylene whisker formed AR structure on glass of Example 1.
Figure 6:
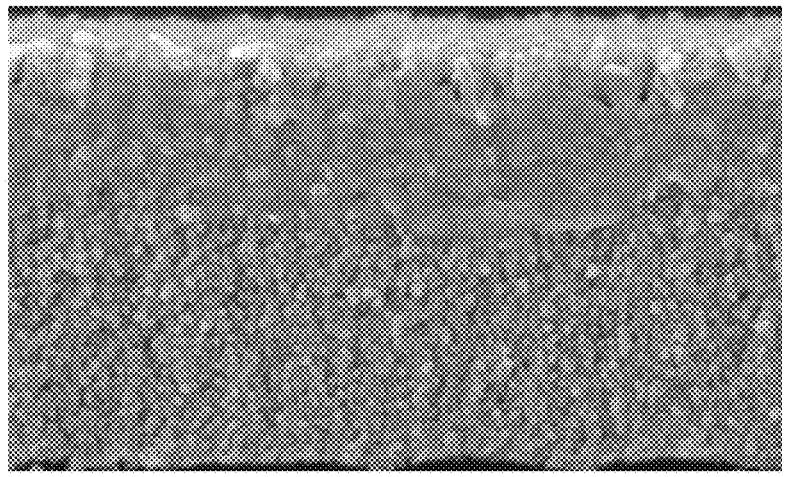
FIG. 6 is a side view SEM micrograph of the thermally stable perylene whisker formed AR structure on glass of Example 1.

The antireflective nanowhisker sacrificial template features 114 can be cleanly baked out leaving antireflective nanostructure features 152 of the thermally stable backfill layer 150. FIG. 5-6 illustrate SEM micrographs of the antireflective nanostructure features 152 of the thermally stable backfill layer 150 formed by this process. These figures illustrate that the antireflective nanowhisker sacrificial template features 114 is capable of being baked out while leaving antireflective nanostructure features 152 of the thermally stable backfill layer 150.

FIG. 3A is a schematic process flow diagram 200 of an illustrative method of forming a hierarchical structured transfer film 230 and resulting final AR structure 250. This method includes forming a transfer film 230 by depositing sacrificial material template layer 12, having antireflective template features 14 on microstructure 9, (illustrated in FIG. 3B as a magnified view) on a release surface 13 of a carrier film 11 (described above) and coating a thermally stable backfill material 22 on the antireflective template features 14 to form a thermally stable backfill layer 22 having a first surface conforming to the antireflective template features 14 with the masking layer 17 and an opposing planar second surface.

The thermally stable backfill solution can be coated onto the microstructure 9 and antireflective nanostructure template features 14 and any solvent or portion of solvent removed and optionally cured to form the thermally stable backfill layer 22. Preferably, after removal of solvent and curing, the thermally stable material substantially planarizes the sacrificial template layer as described above.

The antireflective template features 14 can be formed by any useful process, such as those described above. The microstructure 9 can be formed by any useful process such as a continuous cast and cure process or embossed to produce the microstructure 9.

The lamination transfer film 230 can be laminated to a receptor substrate 40 (described above) and exposed to a heating or baking out process to remove the sacrificial template layer 12 and to form antireflective nanostructure features 252 (illustrated in FIG. 3C as a magnified view) of the thermally stable backfill layer 250. In some embodiments, an optional sacrificial adhesive layer (not shown) is applied to the backfill layer 22 or to receptor substrate 40, prior to lamination.

The sacrificial template layer 12 and/or antireflective nanowhisker template features 114 can be cleanly baked out leaving antireflective nanostructure features 252 of the thermally stable backfill layer 250. FIGS. 7, 8 14A, 14B, 15A and 15B illustrate SEM micrographs of the antireflective nanostructure features 252 of the thermally stable backfill layer 250 formed by this process. These figures illustrate that the sacrificial template layer 12 and/or antireflective nanowhisker template features 114 are capable of being baked out while leaving antireflective nanostructure features 252 of the thermally stable backfill layer 250.

Thermally Stable Material

A thermally stable material is utilized to form the thermally stable backfill layer of the transfer film. The thermally stable material includes thermally stable molecular species. It is understood that the thermally stable material and the thermally stable molecular species includes precursor materials that either are or transform into materials that remain substantially intact during the removal of sacrificial materials, such as during "bake out" or pyrolysis.

Materials that may be used for the backfill include polysiloxane resins, polysilazanes, polyimides, silsesquioxanes of bridge or ladder-type, silicones, and silicone hybrid materials and many others. Exemplary polysiloxane resins are available under the trade designation PERMANEW 6000, available from California Hardcoating Company, Chula Vista, Calif. These molecules typically have an inorganic component which leads to high dimensional stability, mechanical strength, and chemical resistance, and an organic component that helps with solubility and reactivity.

In many embodiments the thermally stable molecular species includes silicon, hafnium, strontium, titanium or zirconium. In some embodiments the thermally stable molecular species includes a metal, metal oxide or metal oxide precursor. Metal oxide precursors may be used in order to act as an amorphous "binder" for inorganic nanoparticles, or they may be used alone.

In many embodiments, the materials useful in the current invention belong to a class of the highly branched organosilicon oligomers and polymers of a general formula (as below) which can be further reacted to form crosslinked networks by homo-condensation of Si—OH groups, heterocondensation with the remaining hydrolyzable groups (e.g., alkoxy), and/or by reactions of the functional organic groups (e.g., ethylenically unsaturated). This class of materials is derived primarily from organosilanes of a general formula:

$$R_xSiZ_{4-x},$$

wherein

R is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these.

Z is a hydrolyzable group, such as halogen (containing the elements F, Br, Cl, or I), $C_1$-$C_{20}$ alkoxy, $C_5$-$C_{20}$ aryloxy, and/or combinations of these.

The majority of the composition may consist of $RSiO_{3/2}$ units thus the class of materials is often called silsesquioxanes (or T-resins), however they may also contain mono- ($R_3Si$—$O_{1/2}$), di-($R_2SiO_{2/2}$) and tetrafunctional groups ($Si$—$O_{4/2}$). Organically-modified disilanes of the formula:

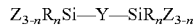
$$Z_{3-n}R_nSi\text{—}Y\text{—}SiR_nZ_{3-n}$$

are often used in the hydrolyzable compositions to further modify the properties of the materials (to form the so-called bridged silsesquioxanes), the R and Z groups are defined above. The materials can be further formulated and reacted with metal alkoxides ($M(OR)_m$) to form metallo-silsesquioxanes.

In many embodiments the highly branched organosilicon oligomers and polymers of a general formula:

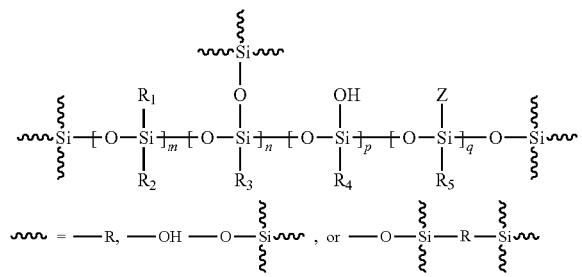

$R_1$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_2$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_3$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_4$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_5$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

Z is a hydrolyzable group, such as halogen (containing the elements F, Br, Cl, or I), $C_1$-$C_{20}$ alkoxy, $C$-$C_{20}$ aryloxy, and/or combinations of these.

m is an integer from 0 to 500;
n is an integer from 1 to 500;
p is an integer from 0 to 500;
q is an integer from 0 to 100.

As used herein, the term "substituted" refers to one substituted with at least a substituent selected from the group consisting of a halogen (containing the elements F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, alkyl group, a $C_2$ to $C_{20}$ alkenyl group, a $C_2$ to $C_{20}$ alkynyl group, $C_6$ to $C_{30}$ aryl group, a $C_7$ to $C_{13}$ arylalkyl group, a $C_1$ to $C_4$ oxyalkyl group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a heterocycloalkyl group, and a combination thereof, instead of hydrogen of a compound.

The resulting highly branched organosilicon polymer has a molecular weight in a range from 150 to 300,000 Da or preferably in a range from 150 to 30,000 Da.

Preferably, the thermally stable backfill contains the reaction product of the hydrolysis and condensation of a methyltriethoxysilane precursor in a polar solvent. After synthesis, the resulting polymer preferably has a molecular weight of nominally less than 30,000 Da. The thermally stable backfill solution also preferably includes less than fifty percent by weight silica nanoparticles nominally of a size between 10-50 nanometers.

The thermally stable compositions described herein preferably comprise inorganic nanoparticles. These nanoparticles can be of various sizes and shapes. The nanoparticles can have an average particle diameter less than about 1000 nm, less than about 100 nm, less than about 50 nm, or less than about 35 nm. The nanoparticles can have an average particle diameter from about 3 nm to about 50 nm, or from about 3 nm to about 35 nm, or from about 5 nm to about 25 nm. If the nanoparticles are aggregated, the maximum cross sectional dimension of the aggregated particle can be within any of these ranges, and can also be greater than about 100 nm. "Fumed" nanoparticles, such as silica and alumina, with primary size less than about 50 nm, may also be used, such as CAB-OSPERSE PG 002 fumed silicas, CAB-O-SPERSE 2017A fumed silicas, and CAB-OSPERSE PG 003 fumed alumina, available from Cabot Co. Boston, Mass. Their measurements can be based on transmission electron microscopy (TEM). Nanoparticles can be substantially fully condensed. Fully condensed nanoparticles, such as the colloidal silica, typically have substantially no hydroxyls in their interiors. Non-silica containing fully condensed nanoparticles typically have a degree of crystallinity (measured as isolated particles) greater than 55%, preferably greater than 60%, and more preferably greater than 70%. For example, the degree of crystallinity can range up to about 86% or greater. The degree of crystallinity can be determined by X-ray diffraction techniques. Condensed crystalline (e.g., zirconia) nanoparticles have a high refractive index whereas amorphous nanoparticles typically have a lower refractive index. Various shapes of the inorganic or organic nanoparticles may be used, such as sphere, rod, sheet, tube, wire, cube, cone, tetrahedron, and the like.

The size of the particles is generally chosen to avoid significant visible light scattering in the final article. The nanomaterial selected can impart various optical properties (i.e., refractive index, birefringence), electrical properties (e.g., conductivity), mechanical properties (e.g., toughness, pencil hardness, scratch resistance) or a combination of these properties. It may be desirable to use a mix of organic and inorganic oxide particle types to optimize an optical or material property and to lower total composition cost.

Examples of suitable inorganic nanoparticles include metal nanoparticles or their respective oxides, including the elements zirconium or zirconia (Zr), titanium or titania (Ti), hafnium (Hf), aluminum or alumina (Al), iron (Fe), vanadium (V), antimony (Sb), tin (Sn), gold (Au), copper (Cu), gallium (Ga), indium (In), chromium (Cr), manganese (Mn), cobalt (Co), nickel (Ni), zinc (Zn), yttrium (Y), niobium (Nb), molybdenum (Mo), technetium (Te), ruthenium (Ru), rhodium (Rh), palladium (Pd), silver (Ag), cadmium (Cd), lanthanum (La), tantalum (Ta), tungsten (W), rhenium (Rh), osmium (Os), iridium (Ir), platinum (Pt), and any combinations thereof.

In a preferred embodiment, nanoparticles of zirconium oxide (zirconia) are used. Zirconia nanoparticles can have a particle size from approximately 5 nm to 50 nm, or 5 nm to 15 nm, or 10 nm. Zirconia nanoparticles can be present in the durable article or optical element in an amount from 10 to 70 wt %, or 30 to 50 wt %. Zirconias for use in materials of the invention are commercially available from Nalco Chemical Co. (Naperville, Ill.) under the product designation NALCO OOSSOO8 and from Buhler AG Uzwil, Switzerland under the trade designation "Buhler zirconia Z-WO sol". Zirconia nanoparticle can also be prepared such as described in U.S. Pat. No. 7,241,437 (Davidson et al.) and U.S. Pat. No. 6,376,590 (Kolb et al.). Titania, antimony oxides, alumina, tin oxides, and/or mixed metal oxide nanoparticles can be present in the durable article or optical element in an amount from 10 to 70 wt %, or 30 to 50 wt %. Densified ceramic oxide layers may be formed via a "sol-gel" process, in which ceramic oxide particles are incorporated into a gelled dispersion with a precursor of at least one modifying component followed by dehydration and firing, as described in U.S. Pat. No. 5,453,104 (Schwabel). Mixed metal oxide for use in materials of the invention are commercially available from Catalysts & Chemical Industries Corp., (Kawasaki, Japan) under the product designation OPTOLAKE.

Other examples of suitable inorganic nanoparticles include elements and alloys known as semiconductors and their respective oxides such as silicon (Si), germanium (Ge), silicon carbide (SiC), silicon germanide (SiGe), aluminium nitride (AlN), aluminium phosphide (AlP), boron nitride (BN), boron carbide ($B_4C$), gallium antimonide (GaSb), indium phosphide (InP), gallium arsenide nitride (GaAsN), gallium arsenide phosphide (GaAsP), indium aluminum arsenide nitride (InAlAsN), zinc oxide (ZnO), zinc selenide (ZnSe), zinc sulfide (ZnS), zinc telluride (ZnTe), mercury zinc selenide (HgZnSe), lead sulfide (PbS), lead telluride (PbTe), tin sulfide (SnS), lead tin telluride (PbSnTe), thallium tin telluride ($Tl_2SnTe_5$), zinc phosphide ($Zn_3P_2$), zinc arsenide ($Zn_3As_2$), zinc antimonide ($Zn_3Sb_2$), lead(II) iodide ($PbI_2$), copper(I) oxide ($Cu_2O$).

Silicon dioxide (silica) nanoparticles can have a particle size from 5 nm to 75 nm or 10 nm to 30 nm or 20 nm. Silica nanoparticles are typically in an amount from 10 to 60 wt.-%. Typically the amount of silica is less than 40 wt %. Suitable silicas are commercially available from Nalco Chemical Co. (Naperville, Ill.) under the trade designation NALCO COLLOIDAL SILICAS. For example, silicas include NALCO trade designations 1040, 1042, 1050, 1060, 2327 and 2329, the organosilica under the product name IPA-ST-MS, IPA-ST-L, IPA-ST, IPA-ST-UP, MA-ST-M, and MAST sols from Nissan Chemical America Co. Houston, Tex. and the SNOWTEX ST-40, ST-50, ST-20L, ST-C, ST-N, ST-O, ST-OL, ST-ZL, ST-UP, and ST-OUP, also from Nissan Chemical America Co. Houston, Tex. Suitable fumed silicas include for example, products sold under the tradename, AEROSIL series OX-50, -130, -150, and -200 available from DeGussa AG, (Hanau, Germany), and CAB-O-SPERSE 2095, CAB-O-SPERSE A105, CAB-O-SIL M5 available from Cabot Corp. (Tuscola, Ill.). The weight ratio of polymerizable material to nanoparticles can range from about 30:70, 40:60, 50:50, 55:45, 60:40, 70:30, 80:20 or 90:10 or more. The preferred ranges of weight percent of nanoparticles range from about 10 wt % to about 60% by weight, and can depend on the density and size of the nanoparticle used.

In many embodiments, the thermally stable backfill layer includes zirconia, titania, alumina, boron carbide, or silicon carbide nanoparticles. In some embodiments, the thermally stable backfill layer includes zirconia. In some embodiments, the thermally stable backfill layer includes titania. In some embodiments, the thermally stable backfill layer includes alumina. In some embodiments, the thermally stable backfill layer includes boron carbide. In some embodiments, the thermally stable backfill layer includes silicon carbide.

Within the class of semiconductors include nanoparticles known as "quantum dots," which have interesting electronic and optical properties that can be used in a range of applications. Quantum dots can be produced from binary alloys such as cadmium selenide, cadmium sulfide, indium arsenide, and indium phosphide, or from ternary alloys such as cadmium selenide sulfide, and the like. Companies that sell quantum dots include Nanoco Technologies (Manchester, UK) and Nanosys (Palo Alto, Calif.).

Examples of suitable inorganic nanoparticles include elements known as rare earth elements and their oxides, such as lanthanum (La), cerium ($CeO_2$), praseodymium ($Pr_6O_{11}$), neodymium ($Nd_2O_3$), samarium ($Sm_2O_3$), europium ($Eu_2O_3$), gadolinium ($Gd_2O_3$), terbium ($Tb_4O_7$), dysprosium ($Dy_2O_3$), holmium ($Ho_2O_3$), erbium ($Er_2O_3$), thulium ($Tm_2O_3$), ytterbium ($Yb_2O_3$) and lutetium ($Lu_2O_3$). Additionally, phosphorescent materials known as "phosphors" may be included in the thermally stable backfill material. These may include calcium sulfide with strontium sulfide with bismuth as an activator (CaxSr)S:Bi, Zinc sulfide with copper "GS phosphor", mixtures of zinc sulfide and cadmium sulfide, strontium aluminate activated by Europium ($SrAl_2O_4$:Eu(II):Dy(III)), $BaMgAl_{10}O_{17}$:$Eu^{2+}$ (BAM), $Y_2O_3$:Eu, doped ortho-silicates, Yttrium aluminium garnet (YAG) and Lutetium aluminium garnet (LuAG) containing materials, any combinations thereof, and the like. A commercial example a phosphor may include one of the ISIPHOR™ inorganic phosphors (available from Merck KGaA, Darmstadt, Germany).

The nanoparticles are typically treated with a surface treatment agent. Surface-treating the nano-sized particles can provide a stable dispersion in the polymeric resin. Preferably, the surface-treatment stabilizes the nanoparticles so that the particles will be well dispersed in a substantially homogeneous composition. Furthermore, the nanoparticles can be modified over at least a portion of its surface with a surface treatment agent so that the stabilized particle can copolymerize or react with the parts of the composition during curing. In general, a surface treatment agent has a first end that will attach to the particle surface (covalently, ionically or through strong physisorption) and a second end that imparts compatibility of the particle with the composition and/or reacts with resin during curing. Examples of surface treatment agents include alcohols, amines, carboxylic acids, sulfonic acids, phosphonic acids, silanes and titanates. The preferred type of treatment agent is determined, in part, by the chemical nature of the metal oxide surface. Silanes are preferred for silica and other for siliceous fillers. Silanes and carboxylic acids are preferred for metal oxides such as zirconia. The surface modification can be done either subsequent to mixing with the monomers or after mixing. It is preferred in the case of silanes to react the silanes with the particle or nanoparticle surface before incorporation into the composition. The required amount of surface modifier is dependent upon several factors such particle size, particle type, modifier molecular weight, and modifier type. In general it is preferred that approximately a monolayer of modifier is attached to the surface of the particle. The attachment procedure or reaction conditions required also depend on the surface modifier used. For silanes, it is preferred to surface treat at elevated temperatures under acidic or basic conditions for from 1-24 hr approximately. Surface treatment agents such as carboxylic acids may not require elevated temperatures or extended time.

Representative embodiments of surface treatment agents suitable for the compositions include compounds such as, for example, isooctyl trimethoxy-silane, N-(3-triethoxysilylpropyl) methoxyethoxyethoxyethyl carbamate (PEG$_3$TES), N-(3-triethoxysilylpropyl) methoxyethoxyethoxyethyl carbamate (PEG$_2$TES), 3-(methacryloyloxy)propyltrimethoxysilane, 3-acryloxypropyltrimethoxysilane, 3-(methacryloyloxy)propyltriethoxysilane, 3-(methacryloyloxy)propylmethyldimethoxysilane, 3-(acryloyloxypropyl)methyldimethoxysilane, 3-(methacryloyloxy)propyldimethylethoxysilane, 3-(methacryloyloxy) propyldimethylethoxysilane, vinyldimethylethoxysilane, phenyltrimethoxysilane, n-octyltrimethoxysilane, dodecyltrimethoxysilane, octadecyltrimethoxysilane, propyltrimethoxysilane, hexyltrimethoxysilane, vinylmethyldiacetoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltris-isobutoxysilane, vinyltriisopropenoxysilane, vinyltris(2-methoxyethoxy) silane, styrylethyltrimethoxysilane, mercaptopropyltrimethoxysilane, 3-5 glycidoxypropyltrimethoxysilane, acrylic acid, methacrylic acid, oleic acid, stearic acid, dodecanoic acid, 2-[2-(2-methoxyethoxy) ethoxy]acetic acid (MEEAA), beta-carboxyethylacrylate, 2-(2-methoxyethoxy)acetic acid, methoxyphenyl acetic acid, and mixtures thereof. Further, a proprietary silane surface modifier, commercially available from OSI Specialties, Crompton South Charleston, W. Va. under the trade designation "Silquest A1230", has been found particularly suitable.

In some embodiments the thermally stable molecular species includes a metal, metal oxide or metal oxide precursor. Metal oxide precursors may be used in order to act as an amorphous "binder" for inorganic nanoparticles, or they may be used alone. Sol-gel techniques may be used to react these precursors in order to cure the material into a solid mass and are known to those skilled in the art. Suitable metal oxide precursors include alkyl titanates such as titanium (IV) butoxide, n-propyl titanate, titanium triethanolamine, titanium phosphate glycol, 2-ethylhexyl titanate, titanium (IV) ethoxide, titanium (IV) isopropoxide, and the like. These are commercially available under the "TYZOR" trade name owned by Dorf-Ketal Inc. (Houston, Tex.). Also suitable metal oxide precursors include zirconium chloride or zirconium(IV) alkoxides such as zirconium (IV) acrylate, zirconium(IV) tetraisopropoxide, zirconium(IV) tetraethoxide, zirconium(IV) tetrabutoxide, and the like, all available from Aldrich (St. Louis, Mo.). Also suitable metal oxide precursors include hafnium(IV) chloride or hafnium alkoxides such as hafnium(IV) carboxyethyl acrylate, hafnium (IV) tetraisopropoxide, hafnium(IV) tert-butoxide, hafnium (IV) n-butoxide, also available from Aldrich (St. Louis, Mo.). These materials can also be used as inorganic nanomaterials in the sacrificial template layer in order to form the bridging layer.

Sacrificial Materials

The sacrificial layer is a material capable of being baked out or otherwise removed while leaving the structured surface layer and the bridging layer, substantially intact. The sacrificial layer includes, for example, the sacrificial template layer and the optional sacrificial releasable layer, depending upon a construction of the transfer film.

The sacrificial layer can have the antireflective nanostructure template features alone or in addition to a microstructured surface. The antireflective nanostructure template features can be formed as described above. The microstructure can be formed through embossing, a replication process, extrusion, casting, or surface structuring, for example. The structured surface can include nanostructures, microstructures, or hierarchical structures. Nanostructures comprise features having at least one dimension (e.g., height, width, or length) less than or equal to 2 micrometers. Microstructures comprise features having at least one dimension (e.g., height, width, or length) less than or equal to one millimeter. Hierarchical structures are combinations of nanostructures and microstructures.

The sacrificial layer can comprise any material as long as the desired properties are obtained. Preferably, the sacrificial layer is made from a polymerizable composition comprising polymers having number average molecular weights of about 1,000 Da or less (e.g., monomers and oligomers). Particularly suitable monomers or oligomers have molecular weights of about 500 Da or less, and even more particularly suitable polymerizable molecules have molecular weights of about 200 Da or less. Said polymerizable compositions are typically cured using actinic radiation, e.g., visible light, ultraviolet radiation, electron beam radiation, heat and combinations thereof, or any of a variety of conventional anionic, cationic, free radical or other polymerization techniques, which can be photochemically or thermally initiated.

Useful polymerizable compositions comprise curable functional groups known in the art, such as epoxide groups, allyloxy groups, (meth)acrylate groups, epoxide, vinyl, hydroxyl, acetoxy, carboxylic acid, amino, phenolic, aldehyde, cinnamate, alkene, alkyne, ethylenically unsaturated groups, vinyl ether groups, and any derivatives and any chemically compatible combinations thereof.

The polymerizable composition used to prepare the sacrificial template layer may be monofunctional or multifunctional (e.g., di-, tri-, and tetra-) in terms of radiation curable moieties. Examples of suitable monofunctional polymerizable precursors include styrene, alpha-methylstyrene, substituted styrene, vinyl esters, vinyl ethers, octyl (meth) acrylate, nonylphenol ethoxylate (meth)acrylate, isobornyl (meth)acrylate, isononyl (meth)acrylate, 2-(2-ethoxyethoxy) ethyl (meth)acrylate, 2-ethylhexyl (meth)acrylate, lauryl (meth)acrylate, beta-carboxyethyl (meth)acrylate, isobutyl (meth)acrylate, cycloaliphatic epoxide, alpha-epoxide, 2-hydroxyethyl (meth)acrylate, isodecyl (meth)acrylate, dodecyl (meth)acrylate, n-butyl (meth)acrylate, methyl (meth)acrylate, hexyl (meth)acrylate, (meth)acrylic acid, N-vinylcaprolactam, stearyl (meth)acrylate, hydroxyl functional caprolactone ester (meth)acrylate, isooctyl (meth)acrylate, hydroxyethyl (meth)acrylate, hydroxypropyl (meth)acrylate, hydroxyisopropyl (meth)acrylate, hydroxybutyl (meth) acrylate, hydroxyisobutyl (meth)acrylate, tetrahydrofuryl (meth)acrylate, and any combinations thereof.

Examples of suitable multifunctional polymerizable precursors include ethyl glycol di(meth)acrylate, hexanediol di(meth)acrylate, triethylene glycol di(meth)acrylate, tetraethylene glycol di(meth)acrylate, trimethylolpropane tri (meth)acrylate, trimethylolpropanepropane tri(meth)acrylate, glycerol tri(meth)acrylate, pentaerythritol tri(meth) acrylate, pentaerythritol tetra(meth)acrylate, neopentyl glycol di(meth)acrylate, bisphenol A di(meth)acrylate, poly (1,4-butanediol) di(meth)acrylate, any substituted, ethoxylated or propoxylated versions of the materials listed above, or any combinations thereof The polymerization reactions generally lead to the formation of a three-dimensional "crosslinked" macromolecular network and are also known in the art as negative-tone photoresists, as reviewed by Shaw et al., "Negative photoresists for optical lithography," IBM Journal of Research and Development (1997) 41, 81-94. The formation of the network may occur through either covalent, ionic, or hydrogen bonding, or through physical crosslinking mechanisms such as chain entanglement. The reactions can also be initiated through one or more intermediate species, such as free-radical generating photoinitiators, photosensitizers, photoacid generators, photobase generators, or thermal acid generators. The type of curing agent used depends on the polymerizable precursor used and on the wavelength of the radiation used to cure the polymerizable precursor. Examples of suitable commercially available free-radical generating photoinitiators include benzophenone, benzoin ether, and acylphosphine photoinitiators, such as those sold under the trade designations "IRGACURE" and "DAROCUR" from Ciba Specialty Chemicals, Tarrytown, N.Y. Other exemplary photoinitiators include 2,2-dimethoxy-2-phenylacetophenone (DMPAP), 2,2-dimethoxyacetophenone (DMAP), xanthone, and thioxanthone.

Co-initiators and amine synergists may also be included to improve curing rates. Suitable concentrations of the curing agent in the crosslinking matrix range from about 1 wt. % to about 10 wt. %, with particularly suitable concentrations ranging from about 1 wt. % to about 5 wt. %, based on the entire weight of the polymerizable precursor. The polymerizable precursor may also include optional additives, such as heat stabilizers, ultraviolet light stabilizers, free-radical scavengers, and combinations thereof.

Examples of suitable commercially available ultraviolet light stabilizers include benzophenone-type ultraviolet absorbers, which are available under the trade designation "UVINOL 400" from BASF Corp., Parsippany, N.J.; under the trade designation "CYASORB UV-1164" from Cytec Industries, West Patterson, N.J.; and under the trade designations "TINUVIN 900," "TINUVIN 123" and "TINUVIN 1130" from Ciba Specialty chemicals, Tarrytown, N.Y. Examples of suitable concentrations of ultraviolet light stabilizers in the polymerizable precursor range from about 0.1 wt. % to about 10 wt. %, with particularly suitable total concentrations ranging from about 1 wt. % to about 5 wt. %, relative to the entire weight of the polymerizable precursor.

Examples of suitable free-radical scavengers include hindered amine light stabilizer (HALS) compounds, hydroxylamines, sterically hindered phenols, and combinations thereof. Examples of suitable commercially available HALS compounds include the trade designated "TINUVIN 292" from Ciba Specialty Chemicals, Tarrytown, N.Y., and the trade designated "CYASORB UV-24" from Cytec Industries, West Patterson, N.J. Examples of suitable concentrations of free radical scavengers in the polymerizable precursor range from about 0.05 wt. % to about 0.25 wt. %.

Patterned structured template layers can be formed by depositing a layer of a radiation curable composition onto one surface of a radiation transmissive carrier to provide a layer having an exposed surface, contacting a master with a preformed surface bearing a pattern capable of imparting a three-dimensional structure of precisely shaped and located interactive functional discontinuities including distal surface portions and adjacent depressed surface portions into the exposed surface of the layer of radiation curable composition on said carrier under sufficient contact pressure to impart said pattern into said layer, exposing said curable composition to a sufficient level of radiation through the carrier to cure said composition while the layer of radiation curable composition is in contact with the patterned surface of the master. This cast and cure process can be done in a continuous (3C) manner using a roll of carrier, depositing a layer of curable material onto the carrier, laminating the curable material against a master and curing the curable material using actinic radiation. The resulting roll of carrier with a patterned, structured template disposed thereon can then be rolled up. This method is disclosed, for example, in U.S. Pat. No. 6,858,253 (Williams et al.).

Other materials that may be used for the sacrificial layer include, polyvinyl alcohol (PVA), ethylcellulose, methylcellulose, polynorbornes, poly(methylmethacrylate (PMMA), poly(vinylbutyral), poly(cyclohexene carbonate), poly(cyclohexene propylene) carbonate, poly(ethylene carbonate) poly(propylene carbonate) and other aliphatic polycarbonates, and any copolymer or blend thereof, and other materials described in chapter 2, section 2.4 "Binders" of R. E. Mistler, E. R. Twiname, Tape Casting: Theory and Practice, American Ceramic Society, 2000. There are many commercial sources for these materials. These materials are typically easy to remove via dissolution or thermal decomposition via pyrolysis or combustion. Thermal heating is typically part of many manufacturing processes and thus removal of the sacrificial material may be accomplished during an existing heating step. For this reason, thermal decomposition via pyrolysis or combustion is a more preferred method of removal.

There are several properties that are preferred in the sacrificial materials. The material should be capable of being coated onto a substrate via extrusion, knife coating, solvent coating, cast and cure, or other typical coating methods. It is preferred that the material be a solid at room temperature. For thermoplastic sacrificial materials, it is preferred that the glass transition temperature (Tg) is low enough to allow it to be embossed by a heated tool. Thus, it is preferred that the sacrificial material have a Tg above 25° C., more preferred above 40° C. and most preferred above 90° C.

Another material property that is desired for the sacrificial material is that its decomposition temperature be above the curing temperature of the backfill material(s). Once the backfill material is cured, the structured layer is permanently formed and the sacrificial template layer can be removed via any one of the methods listed above. Materials that thermally decompose with low ash or low total residue are preferred over those that have higher residuals. Residue left behind on a substrate may adversely impact electrical and/or optical properties such as conductivity, transparency or color of the final product. Since it is desirable to minimize any changes to these properties in the final product, residual levels of less than 1000 ppm are preferred. Residuals levels of less than 500 ppm are more preferred and residual level below 50 ppm are most preferred.

The term "cleanly baked out" means that the sacrificial layer can be removed by pyrolysis, combustion, sublimation or vaporization without leaving a substantial amount of residual material such as ash. Examples of preferred residual levels are provided above, although different residual levels can be used depending upon a particular application.

Sacrificial Adhesive Layer

The sacrificial adhesive layer can be implemented with any material enhancing adhesion of the transfer film to the receptor substrate without substantially adversely affecting the performance of the transfer film. This layer can also be described as an adhesion promoting layer. The sacrificial adhesive layer appears to facilitate the final permanent bond between the receptor substrate and the baked-out thermally stable structure. The sacrificial adhesive layer is capable of being cleanly baked out during the methods described herein.

Objects and advantages of this disclosure are further illustrated by the following examples, but the particular materials and amounts thereof recited in these examples, as well as other conditions and details, should not be construed to unduly limit this disclosure.

EXAMPLES

All parts, percentages, ratios, etc. in the examples are by weight, unless noted otherwise. Solvents and other reagents used are obtained from Sigma-Aldrich Corp., St. Louis, Mo. unless specified differently.

The Reflectance (Average Reflection % or % R) of a plasma treated surface was measured using BYK Gardner color guide sphere. One sample of each film was prepared by applying Yamato Black Vinyl Tape #200-38 (obtained from Yamato International Corporation, Woodhaven, Mich.) to the backside of the sample. A clear glass slide of which transmission and reflection from both sides were predetermined was utilized to establish the % reflection from the black tape. The black tape was laminated to the backside of the sample using a roller to ensure there were no air bubbles trapped between the black tape and the sample. To measure the front surface total Reflectance (% R, specular and diffuse) by an integrating sphere detector, the sample was placed in the machine so that the non-tape side was against the aperture. The Reflectance (% R) was measured at a 10° incident angle and average Reflectance (% R) was calculated by subtracting the Reflectance (% R) of the black tape for the wavelength range of 400-700 nm.

Example 1—Unstructured Perylene Whisker AR

Perylene Coating

The base film was an unprimed 2-mil Kapton H. Samples were placed in a batch coater with a starting base pressure of 7×10-7 Torr. Perylene red pigment (PV Fast Red B, CAS#4948-15-6) was vapor deposited onto the surface of the supplied sheets at a rate of ~6 Å/sec to achieve a total perylene thickness of 2000 Å (200 nm). The batch coater was then vented and the samples were placed into a batch oven that was slowly heated up to a maximum temperature of 268° C. (6 hours) at ~18 mTorr and then turned off and slowly cooled to RT before being vented and removed. The perylene whiskers are shown in FIG. 4.

Backfill Coating

A section of the perylene coated film was attached to a 2 in×3 in microscope slide with tape. PermaNew 6000 (available from California Hardcoating Company, Chula Vista, Calif.) was diluted to 15% w/w in 80:20 IPA/butanol, brought to room temperature, and filtered through a 1.0 um filter. The sample of the treated film was coated with the PermaNew solution, which was applied to the film sample by spin coating on a Cee 200X Precision spin coater (Brewer Science, Inc. Rolla, Mo.). The spin parameters were 500 rpm for 3 seconds (solution application), and 2000 rpm for 30 seconds, then 500 rpm for 10 seconds. Approximately 5 milliliters of the PermaNew solution was applied to the replicated film during the solution application step of the spin cycle. The coated sample was placed in an oven at 80° C. for four hours to cure the PermaNew coating, then cooled to room temperature.

Sacrificial Adhesive Layer Coating

Glass slides, 2 in×3 in, were cleaned with IPA and a lint free cloth. The slide was mounted on the vacuum chuck of a spin coater. The spin coater was programmed for 500 RPM for 5 seconds (coating application step) then 1500 RPM for 10 sec (spin step), then 500 RPM for 60 seconds (dry step).

A solution of IOA/AA Optically Clear Adhesive (90% isooctylacrylate, 10% acrylic acid, as described in US reexam patent 24,906 (Ulrich) was diluted to 5 wt % in 66:33 ethyl acetate/heptane. Approximately 1-2 mL of the IOA/AA solution was applied to the glass slide during the coating application portion of the spin cycle. The slide was then removed from the spin coater and allowed to dry.

Lamination

The film was laminated at 180° F. (PermaNew coating side toward the sacrificial adhesive layer) to the IOA/AA coated glass slide using a thermal film laminator (GBC Catena 35, GBC Document Finishing, Lincolnshire, Ill.). The laminated sample was removed from the laminator and allowed cool to room temperature.

Bake-Out

After lamination, the Kapton support was separated from the laminated layers, leaving the Perma-New, Perylene, and IOA/AA layers adhered to the glass slide. The sample was placed on a hotplate 300° C. at a rate of approximately 10° C./min. The hotplate was held at 300° C. for approximately ten minutes, then heated to 370° C. at a rate of approximately 10° C./min and held for approximately 10 minutes. A propane torch was used to gently heat the sample above 370° C. until the Perylene coating was removed from the surface. The hotplate and sample were then to cool down to ambient temperature. The resulting clean inorganic nanostructure is shown in FIG. 5 and FIG. 6.

Measurement of Average Reflectance at Near Normal Incidence

Each sample was prepared by applying a black vinyl tape (obtained from Yamato International Corporation, Woodhaven, Mich. under the trade designation "#200-38") to the backside of the sample. The black tape was applied using a roller to ensure there are no air bubbles trapped between the black tape and the sample. The same black vinyl tape was similarly applied to an uncoated glass slide of which reflection from both sides are predetermined in order to have a control sample to establish the % reflection from the black vinyl tape in isolation. The non-taped side of first the taped sample and then the control was then placed against the aperture of BYK Gardner color guide sphere (obtained from BYK-Gardner of Columbia, Md. under the trade designation SPECTRO-GUIDE) to measure the front surface total % reflection (specular and diffuse). The % reflection was then measured at a 10° incident angle for the wavelength range of 400-700 nm, and average % reflection was calculated by subtracting out the % reflection of the control, creating the average corrected % reflection. The results of the average % reflection and average corrected % reflection are shown in Table 1.

TABLE 1

Average % reflection and average corrected % reflection for the unstructured perylene whisker AR on glass.

| Sample | Average % Reflection | Average Corrected % Reflection |
|---|---|---|
| Perylene Whiskers | 2.0 | 1.20 |

Example 2—600 nm Structured Perylene Whisker AR

Structured Template

The substrate was a primed 0.002 inch (0.051 mm) thick PET. The replicating resin was a 75/25 blend of SR 399 and SR238 (both available from Sartomer USA, Exton, Pa.) with a photoinitiator package comprising 1% Darocur 1173 (Available from Ciba, Tarrytown, N.Y.), 1.9% triethanolamine (available from Sigma-Aldrich, St. Louis, Mo.), and 0.5% OMAN071 (available from Gelest, Inc. Morrisville, Pa.). Replication of the resin was conducted at 20 ft/min (6.1 m/min) with the replication tool temperature at 137 deg F. (58 deg C.). Radiation from a Fusion "D" lamp operating at 600 W/in was transmitted through the film to cure the resin while in contact with the tool. The replication tool was patterned with a 600 nm pitch linear sawtooth groove.

The replicated template film was primed in a plasma chamber using argon gas at a flow rate of 250 standard cc/min (SCCM) at a pressure of 25 mTorr and RF power of 1000 Watts for 30 seconds. Subsequently, a release coated tool surface was prepared by subjecting the samples to a tetramethylsilane (TMS) plasma at a TMS flow rate of 150 SCCM but no added oxygen, which corresponded to an atomic ratio of oxygen to silicon of about 0. The pressure in the plasma chamber was 25 mTorr, and the RF power of 1000 Watts was used for 10 seconds.

Sacrificial Template Coating

The base film was an unprimed 2-mil Kapton H. The replicating resin was ethoxylated bisphenol A dimethacrylate (SR540, available from Sartomer Company, Exton, Pa.) with a photoinitiator package comprising 0.5% Darocur 1173 and 0.1% TPO. The resin was coated between the base film and a tool film in a nip with a fixed closed gap and a pressure of 80 psi. The laminate was cured with radiation from a Fusion "D" lamp operating at 600 W/in was transmitted through the film to cure the resin while in contact with the tool. The tool film was then removed from the sample, resulting in a structured resin coating on polyimide.

Perylene Coating

Figure 7:
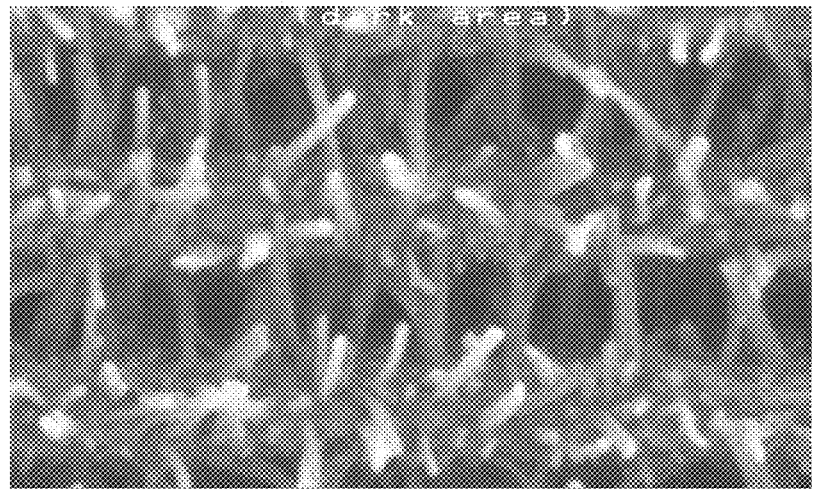
FIG. 7 is a top view SEM micrograph of a perylene whisker sacrificial film of Example 2.

Samples were placed in a batch coater with a starting base pressure of 7×10−7 Torr. Perylene red pigment (PV Fast Red B, CAS#4948-15-6) was vapor deposited onto the surface of the supplied sheets at a rate of ~6 Å/sec to achieve a total perylene thickness of 2000 Å (200 nm). The batch coater was then vented and the samples were placed into a batch oven that was slowly heated up to a maximum temperature of 268° C. (6 hours) at ~18 mTorr and then turned off and slowly cooled to RT before being vented and removed. The resulting perylene structure on the sawtooth structured surface is shown in FIG. 7.

Backfill Coating

A section of the perylene coated structured film was attached to a 2 in×3 in microscope slide with tape. PermaNew 6000 (available from California Hardcoating Company, Chula Vista, Calif.) was diluted to 15% w/w in 80:20 IPA/butanol, and brought to room temperature, and filtered through a 1.0 um filter. The sample of the treated film was coated with the PermaNew solution, which was applied to the film sample by spin coating on a Cee 200X Precision spin coater (Brewer Science, Inc. Rolla, Mo.). The spin parameters were 500 rpm/3 sec (solution application), and 2000 rpm/30 sec, then 500 rpm for 10 seconds. Approximately 5 milliliters of the PermaNew solution was applied to the replicated film during the solution application step of the spin cycle. The coated sample was placed in an oven at 80° C. for four hours to cure the PermaNew coating, then cooled to room temperature.

Sacrificial Adhesive Layer Coating

Glass slides, 2 in×3 in, were cleaned with IPA and a lint free cloth. The slide was mounted on the vacuum chuck of a spin coater. The spin coater was programmed for 500 RPM for 5 seconds (coating application step) then 1500 RPM for 10 sec (spin step), then 500 RPM for 60 seconds (dry step). A solution of IOA/AA Optically Clear Adhesive (90% isooctylacrylate, 10% acrylic acid, as described in US reexam patent 24,906 (Ulrich) was diluted to 5 wt % in 66:33 ethyl acetate/heptane. Approximately 1-2 mL of the IOA/AA solution was applied to the glass slide during the coating application portion of the spin cycle. The slide was then removed from the spin coater and allowed to dry.

Lamination

The film was laminated at 180° F. (PermaNew coating side toward the sacrificial adhesive layer) to the IOA/AA coated glass slide using a thermal film laminator (GBC Catena 35, GBC Document Finishing, Lincolnshire, Ill.). The laminated sample was removed from the laminator and allowed cool to room temperature.

Bake-Out

Figure 8:
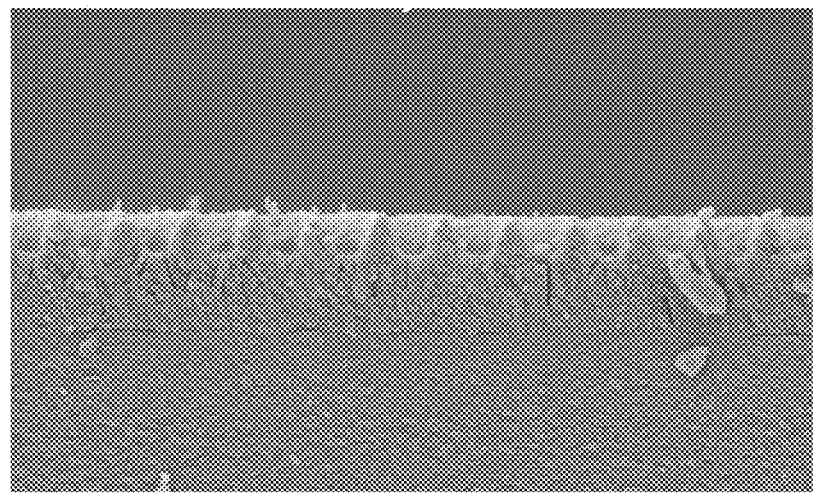
FIG. 8 is a side view SEM micrograph of the resulting inorganic hierarchical nanostructure on glass of Example 2.

After lamination, the Kapton supporting the film stack was separated from the laminated structure, leaving the Perma-New, Perylene, SR540, and IOA/AA layers adhered to the glass slide. The sample was placed on a hotplate 300° C. at a rate of approximately 10° C./min. The hotplate was held at 300° C. for approximately ten minutes to decompose the IOA/AA, then heated to 370° C. at a rate of approximately 10° C./min and held for approximately 10 minutes to decompose the SR540. A propane torch was used to gently heat the sample above 370° C. until the Perylene coating was removed from the surface. The hotplate and sample were then allowed to cool down to ambient temperature. A side view of the resulting inorganic hierarchical nanostructure on glass is shown in FIG. 8.

Example 3—Unstructured QPAC AR

Sacrificial Material Layer Coating

A 5 wt % solution of QPAC 100 (poly(alkylene carbonate) copolymer, Empower Materials, Inc., New Castle, Del.) in 1,3-dioxolane was delivered at a rate of 30 cm³/min to a 10.2 cm (4 inch) wide slot-type coating die in continuous film coating apparatus. The solution was coated on the backside of a release liner (Release Liner, 50 microns thick, commercially available from CP Films, Fieldale, Va. as "T50"). The coated web travelled approximately 2.4 m (8 ft) before entering a 9.1 m (30 ft) conventional air floatation drier with all 3 zones set at 65.5° C. (150° F.). The substrate was moving at a speed of 3.05 m/min (10 ft/min) to achieve a wet coating thickness of about 80 micrometers.

Sputtered-Etch AR Coatings

The samples were sputter etched with the following conditions, and selected samples are shown in Table 2.

TABLE 2

Process conditions for sputter etch samples.

| Sample | TMS Flow sccm | O₂ Flow sccm | Pressure mTorr | Power watts | Speed Ft/min |
|---|---|---|---|---|---|
| Control | | | | | |
| 2 | 30 | 500 | 5.6 | 6000 | 6 |
| 7 | 20 | 500 | 8 | 6000 | 4 |
| 15 | 10 | 500 | 7.3 | 6000 | 4 |

Figure 9A:
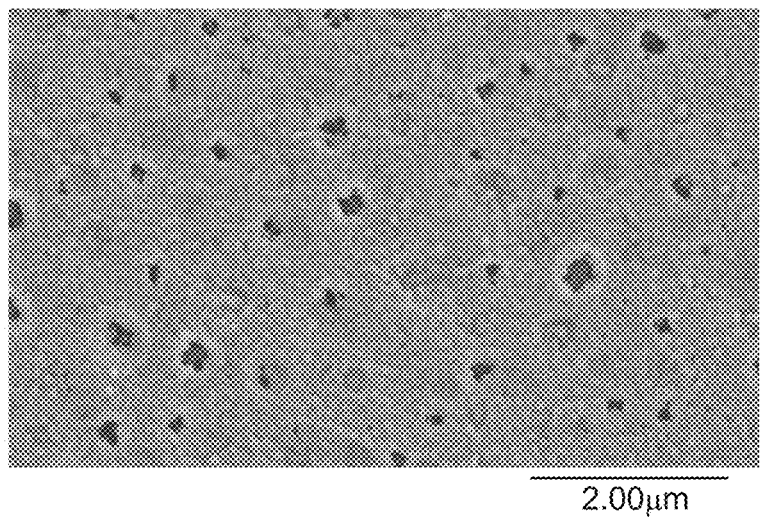
FIG. 9A is a top view SEM micrograph of AR sacrificial template sample 2 of Example 3.
Figure 9B:
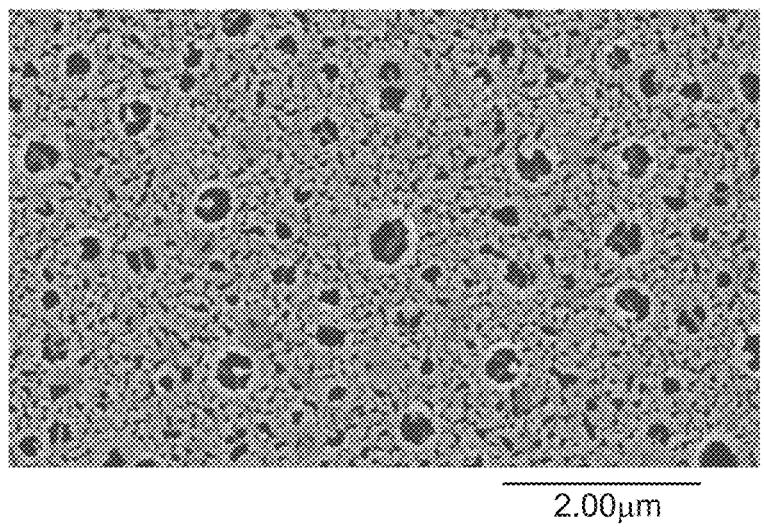
FIG. 9B is a top view SEM micrograph of AR sacrificial template sample 7 of Example 3.
Figure 9C:
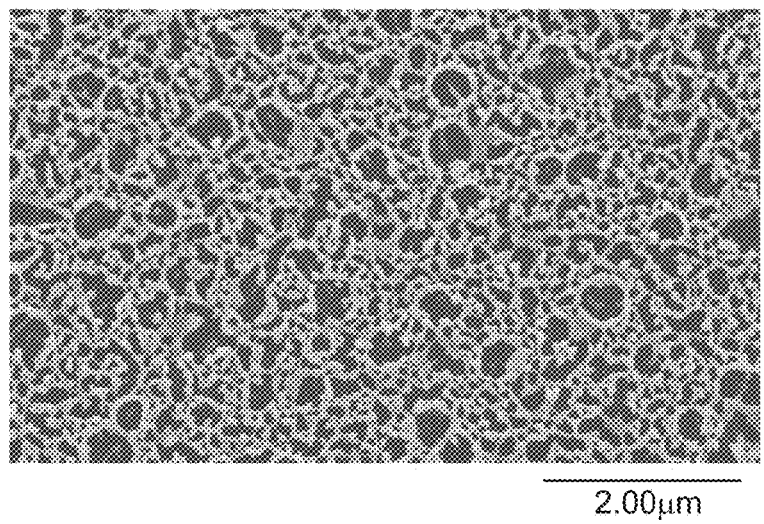
FIG. 9C is a top view SEM micrograph of AR sacrificial template sample 15 of Example 3.

FIG. 9A-C are top view SEMs of QPAC sacrificial template AR samples for three sputter etch conditions: sample 2 (9A), sample 7 (9B), and sample 15 (9C).

Backfill Coating

A section of the sputter etch film was attached to a 2 in×3 in microscope slide with tape. PermaNew 6000 (available from California Hardcoating Company, Chula Vista, Calif.) was diluted to 15% w/w in 80:20 IPA/butanol, brought to room temperature, and filtered through a 1.0 um filter. The sample of the treated film was coated with the PermaNew solution, which was applied to the film sample by spin coating on a Cee 200X Precision spin coater (Brewer Science, Inc. Rolla, Mo.). The spin parameters were 500 rpm for 3 sec (solution application), and 2000 rpm for 30 sec, then 500 rpm for 10 seconds. Approximately 5 milliliters of the PermaNew solution was applied to the replicated film during the solution application step of the spin cycle. The coated sample was placed in an oven at 80° C. for four hours to cure the PermaNew coating, then cooled to room temperature.

Sacrificial Adhesive Layer Coating

Glass slides, 2 in×3 in, were cleaned with IPA and a lint free cloth. A slide was mounted on the vacuum chuck of a spin coater. The spin coater was programmed for 500 RPM for 5 seconds (coating application step) then 1500 RPM for 10 sec (spin step), then 500 RPM for 60 seconds (dry step). A solution of IOA/AA Optically Clear Adhesive (90% isooctylacrylate, 10% acrylic acid, as described in US reexam patent 24,906 (Ulrich) was diluted to 5 wt % in 66:33 ethyl acetate/heptane. Approximately 1-2 mL of the IOA/AA solution was applied to the glass slide during the coating application portion of the spin cycle. The slide was then removed from the spin coater and allowed to dry.

Lamination

The film was laminated at 180° F. (PermaNew coating side toward the sacrificial adhesive layer, to the IOA/AA coated glass slide using a thermal film laminator (GBC Catena 35, GBC Document Finishing, Lincolnshire, Ill.). The laminated sample was removed from the laminator and allowed cool to room temperature.

Bake-Out

After lamination, the PET support was separated from the laminated layers, leaving the Perma-New, QPAC, and IOA/AA layers adhered to the glass slide. The sample was placed in a box furnace (Lindberg Blue M box furnace model BF51732PC-1, Asheville N.C., USA) and brought from 25° C. to 300° C. at a rate of approximately 10° C./min. The furnace was held at 300° C. for thirty minutes, then heated to 500° C. at a rate of approximately 10° C./min and held for one hour to decompose the IOA/AA and the QPAC. The furnace and sample are then allowed to cool down to ambient temperature. The resulting clean inorganic nanostructure was shown in FIG. 10A-C illustrating a top view on the left and a side view on the right of baked out AR nanostructures for sample 2 (10A), sample 7 (10B) and sample 15 (10C).

Measurement of Average Reflectance at Near Normal Incidence

The average % reflection average corrected % reflection were measured as described in Example 1. The results of the average % reflection and average corrected % reflection are shown in Table 3.

TABLE 3

% reflection and corrected % reflection for unstructured QPAC AR on glass

| Sample | Average % Reflection | Average Corrected % Reflection |
|---|---|---|
| QPAC AR 2 | 3.61 | 2.81 |
| QPAC AR 7 | 1.50 | 0.70 |
| QPAC AR 15 | 3.15 | 2.35 |

Example 4—Unstructured SR540 AR

Template

The substrate film was a 2 mil unprimed PET film coated with 8 micron thick PMMA copolymer (75 wt. % polymethylmethacrylate, 25 wt. % polyethyl acrylate, "PRD510-A", Altuglas Inc.) using a roll-to-roll web coating process. The replicating resin was ethoxylated bisphenol A dimethacrylate (SR540, available from Sartomer Company, Exton, Pa.) with a photoinitiator package comprising 0.5% Darocur 1173 and 0.1% TPO. Flat sacrificial films were prepared by coating the substrate film, at a web speed of 10 ft/min (about 3 meters/min.), and the coated web was pressed against unprimed PET using a nip heated to 90° F. (43° C.) and a pressure of 30 psi. The resin was then cured using two banks of FUSION high intensity UV D-bulb lamps (obtained from Fusion Systems, Rockville, Md.), one set at 600 watt/2.5 cm (100% power setting), and the other set at 360 watt/2.5 cm (60% power setting). The cured resin was then separated from the unprimed PET and wound into a roll.

Sputtered-Etch AR Coatings

Figure 11A:
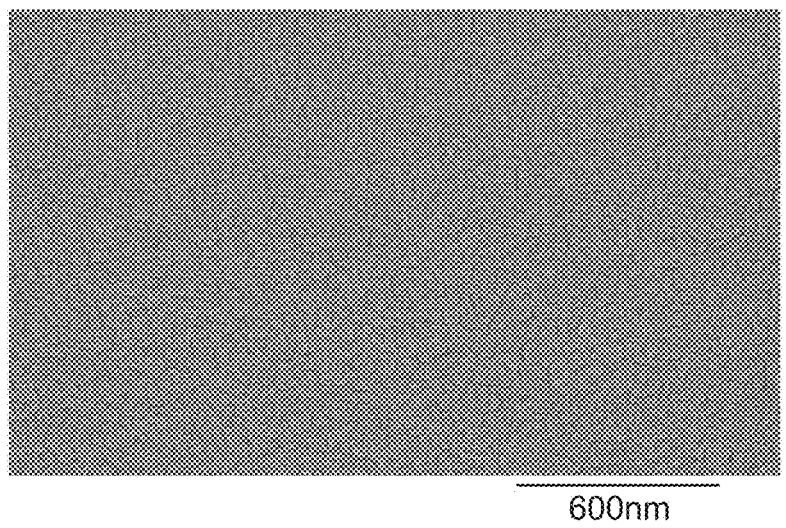
FIG. 11A is a top view of view SEM micrograph of AR sacrificial template sample A of Example 4.
Figure 11B:
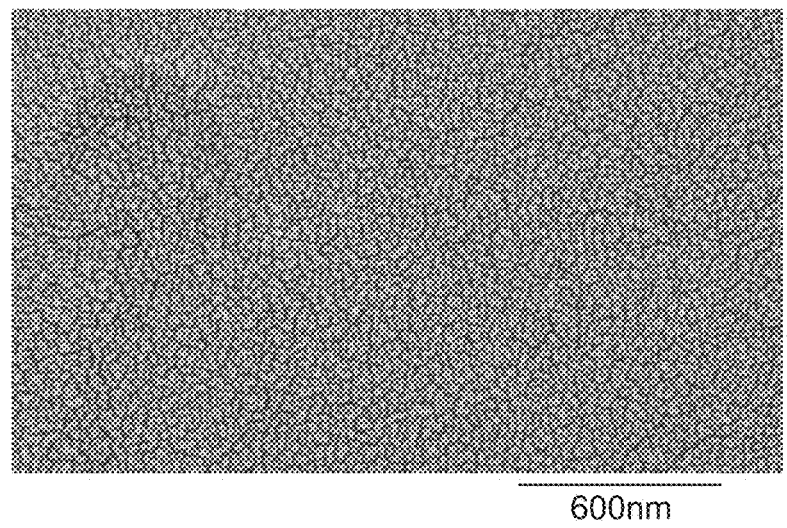
FIG. 11B is a top view of view SEM micrograph of AR sacrificial template sample B of Example 4.
Figure 11C:
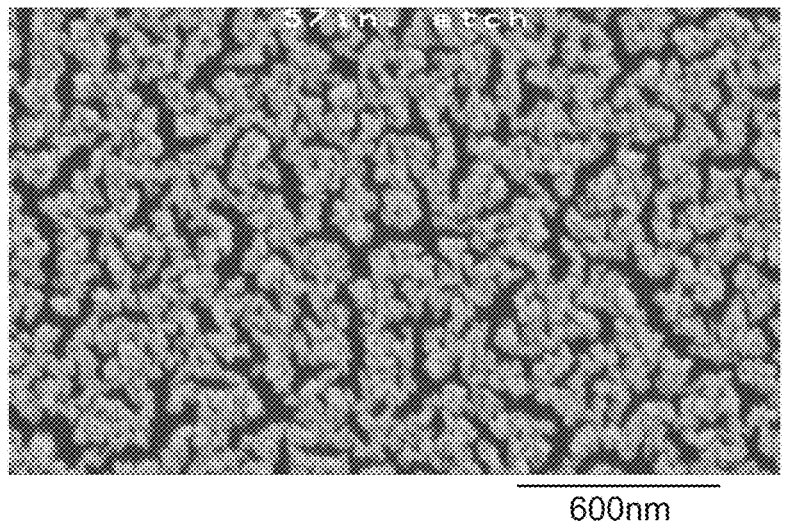
FIG. 11C is a top view of view SEM micrograph of AR sacrificial template sample C of Example 4.

The samples were sputter etched with the following conditions outlined in Table 4, and selected samples top view SEM photos are shown in FIG. 11A (sample A[6]), FIG. 11B (sample B[18]) and FIG. 11C (sample C[57]).

TABLE 4

Process conditions for sputter etch samples.

| Sample | TMS Flow Sccm | O$_2$ Flow sccm | Pressure mTorr | Power watts | Time seconds |
|---|---|---|---|---|---|
| Sample A[6] | 20 | 500 | 5 | 6000 | 15.58 |
| Sample B[18] | 20 | 500 | 5 | 6000 | 46.75 |
| Sample C[57] | 20 | 500 | 5 | 6000 | 148.05 |

Backfill Coating

A section of the sputter etch film was attached to a 2 in×3 in microscope slide with tape. PermaNew 6000 (available from California Hardcoating Company, Chula Vista, Calif.) was diluted to 15% w/w in 80:20 IPA/butanol, brought to room temperature, and filtered through a 1.0 um filter. The sample of the treated film was coated with the PermaNew solution, which was applied to the film sample by spin coating on a Cee 200X Precision spin coater (Brewer Science, Inc. Rolla, Mo.). The spin parameters were 500 rpm for 3 sec (solution application), and 2000 rpm for 30 sec, then 500 rpm for 10 seconds. Approximately 5 milliliters of the PermaNew solution was applied to the replicated film during the solution application step of the spin cycle. The coated sample was placed in an oven at 80° C. for four hours to cure the PermaNew coating, then cooled to room temperature.

Sacrificial Adhesive Layer Coating

Glass slides, 2 in×3 in, were cleaned with IPA and a lint free cloth. The slide was mounted on the vacuum chuck of a spin coater. The spin coater was programmed for 500 RPM for 5 seconds (coating application step) then 1500 RPM for 10 sec (spin step), then 500 RPM for 60 seconds (dry step).

A solution of IOA/AA Optically Clear Adhesive (90% isooctylacrylate, 10% acrylic acid, as described in US reexam patent 24,906 (Ulrich) was diluted to 5 wt % in 66:33 ethyl acetate/heptane. Approximately 1-2 mL of the IOA/AA solution was applied to the glass slide during the coating application portion of the spin cycle. The slide was then removed from the spin coater and allowed to dry.

Lamination

The film was laminated at 180° F. (PermaNew coating side toward the sacrificial adhesive layer) to the IOA/AA coated glass slide using a thermal film laminator (GBC Catena 35, GBC Document Finishing, Lincolnshire, Ill.). The laminated sample was removed from the laminator and allowed cool to room temperature.

Bake-Out

After lamination, the PET support was separated from the laminated layers, leaving the Perma-New, SR540, co-PMMA, and IOA/AA layers adhered to the glass slide. The sample was placed in a box furnace (Lindberg Blue M box furnace model BF51732PC-1, Asheville N.C., USA) and brought from 25° C. to 300° C. at a rate of approximately 10° C./min. The furnace was held at 300° C. for thirty minutes, then heated to 500° C. at a rate of approximately 10° C./min and held for one hour to decompose the IOA/AA, PMMA copolymer and the SR540. The furnace and sample were then allowed to cool down to ambient temperature.

Figure 12A:
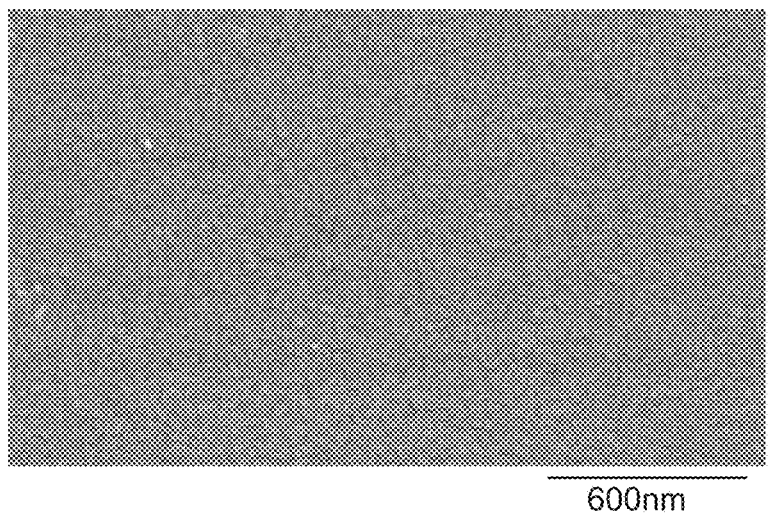
FIG. 12A is a top view of view SEM micrograph of resulting clean inorganic AR nanostructure of Sample A of Example 4.
Figure 12B:
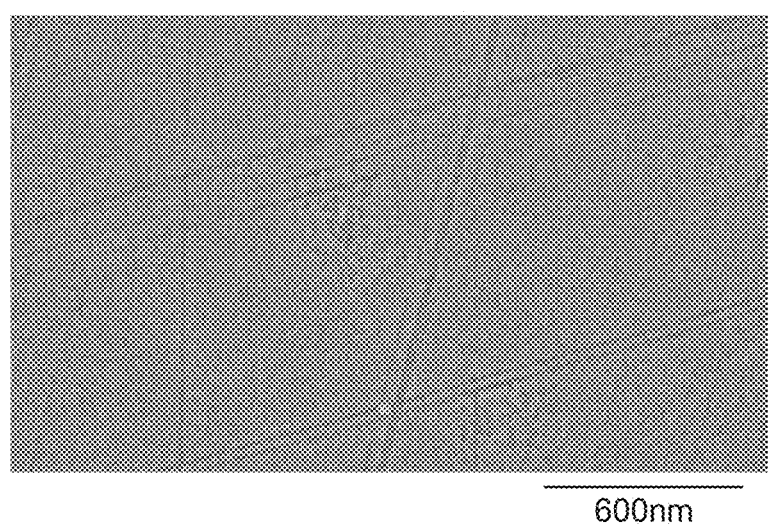
FIG. 12B is a top view of view SEM micrograph of resulting clean inorganic AR nanostructure of Sample B of Example 4.
Figure 12C:
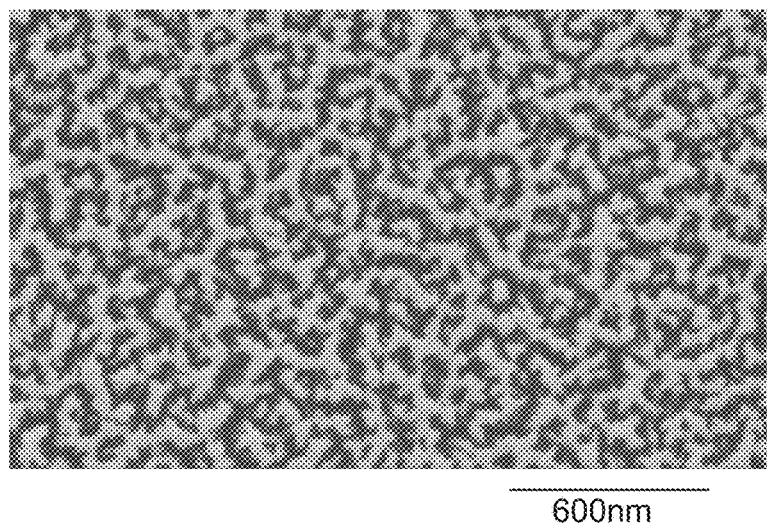
FIG. 12C is a top view of view SEM micrograph of resulting clean inorganic AR nanostructure of Sample C of Example 4.

The resulting clean inorganic nanostructure samples top view SEM photos are shown in FIG. 12A (sample A), FIG. 12B (sample B) and FIG. 12C (sample C).

Measurement of Average Reflectance at Near Normal Incidence

The average % reflection average corrected % reflection were measured as described in Example 1. The results of the average % reflection and average corrected % reflection are shown in Table 5.

TABLE 5

Average % reflection and average corrected % reflection for the unstructured SR540 AR on glass

| Sample | Average % Reflection | Average Corrected % Reflection |
|---|---|---|
| A | 4.18 | 3.38 |
| B | 4.48 | 3.68 |
| C | 1.56 | 0.76 |

Example 5. Unstructured SR540 AR on Sapphire

Template

The substrate film was a 2 mil unprimed PET film coated with 8 micron thick PMMA copolymer (75 wt. % polymethylmethacrylate, 25 wt. % polyethyl acrylate, "PRD510-A", Altuglas Inc.) using a roll-to-roll web coating process. The replicating resin was ethoxylated bisphenol A dimethacrylate (SR540, available from Sartomer Company, Exton, Pa.) with a photoinitiator package comprising 0.5% Darocur 1173 and 0.1% TPO. Flat sacrificial films were prepared by coating the substrate film, at a web speed of 10 ft/min (about 3 meters/min.), and the coated web was pressed against unprimed PET using a nip heated to 90° F. (43° C.) and a pressure of 30 psi. The resin was then cured using two banks of FUSION high intensity UV D-bulb lamps (obtained from Fusion Systems, Rockville, Md.), one set at 600 watt/2.5 cm (100% power setting), and the other set at 360 watt/2.5 cm (60% power setting). The cured resin was then separated from the unprimed PET and wound into a roll.

Sputtered-Etch AR Coatings

The samples are sputter etched with the following conditions shown in Table 6.

TABLE 6

Process conditions for sputter etch Sample A(27).

| Sample | TMS Flow Sccm | O$_2$ Flow sccm | Pressure mTorr | Power watts | Time seconds |
|---|---|---|---|---|---|
| Sample A(27) | 20 | 500 | 5 | 6000 | 70.12 |

Synthesis of Backfill Material

A 500 ml 3-neck round bottom flask was charged with 175.0 grams of a 45.4 wt % solids dispersion of 10 nm zirconia particles (prepared as described in U.S. Pat. Nos. 7,241,437 and 6,376,590). Next, the flask was equipped with a stir bar, stir plate, condenser, heating mantle, thermocouple and temperature controller. With the batch mixing, 78.8 grams methyltriethoxysilane, MTES, (Alfa Aesar, Ward Hill, Mass.) and 80.0 grams anhydrous alcohol (95/5 v/v ethanol/2-propanol, Avantor Performance Materials Inc, Center Valley, Pa.) were added to the batch. The batch was held for 1 hour at room temperature with mixing. After 1 hour, the batch heated to 70° C. and held at 70° C. for 4 hours with mixing. After the 4 hour hold, the batch was allowed to cool to room temperature. This dispersion was filtered through a 1 micron 37 mm syringe filter (Pall Life Sciences, Ann Arbor, Mich.) into a 32 ounce glass bottle. The final sample was a low viscosity, slightly hazy, translucent dispersion and was measured to be 32.9 wt % solids.

Backfill Coating

A section of the sputter etch film was attached to a 2 in×3 in microscope slide with tape. The backfill material synthesized above was diluted to 7.5% w/w in butanol, brought to room temperature, and filtered through a 1.0 um filter. The sample of the treated film was coated with the backfill material, which was applied to the film sample by spin coating on a Cee 200X Precision spin coater (Brewer Science, Inc. Rolla, Mo.). The spin parameters were 500 rpm for 3 sec (solution application), and 5000 rpm for 30 sec, then 500 rpm for 10 seconds. Approximately 5 milliliters of the backfill solution was applied to the replicated film during the solution application step of the spin cycle. The coated sample was placed in an oven at 80° C. for four hours to cure the backfill coating, then cooled to room temperature.

Sacrificial Adhesive Layer Coating

Sapphire substrates were cleaned with IPA and a lint free cloth. The substrate was mounted on the vacuum chuck of a spin coater. The spin coater as programmed for 500 RPM for 5 seconds (coating application step) then 1500 RPM for 10 sec (spin step), then 500 RPM for 60 seconds (dry step).

A solution of IOA/AA Optically Clear Adhesive (90% isooctylacrylate, 10% acrylic acid, as described in US reexam patent 24,906 (Ulrich) was diluted to 5 wt % in 66:33 ethyl acetate/heptane. Approximately 1-2 mL of the IOA/AA solution was applied to the sapphire substrate during the coating application portion of the spin cycle. The substrate was then removed from the spin coater and allowed to dry.

Lamination

The film was laminated at 180° F. (backfill coating toward the sacrificial adhesive layer) to the IOA/AA coated sapphire substrate using a thermal film laminator (GBC Catena 35, GBC Document Finishing, Lincolnshire, Ill.). The laminated sample was removed from the laminator and allowed cool to room temperature.

Bake-Out

Figure 13:
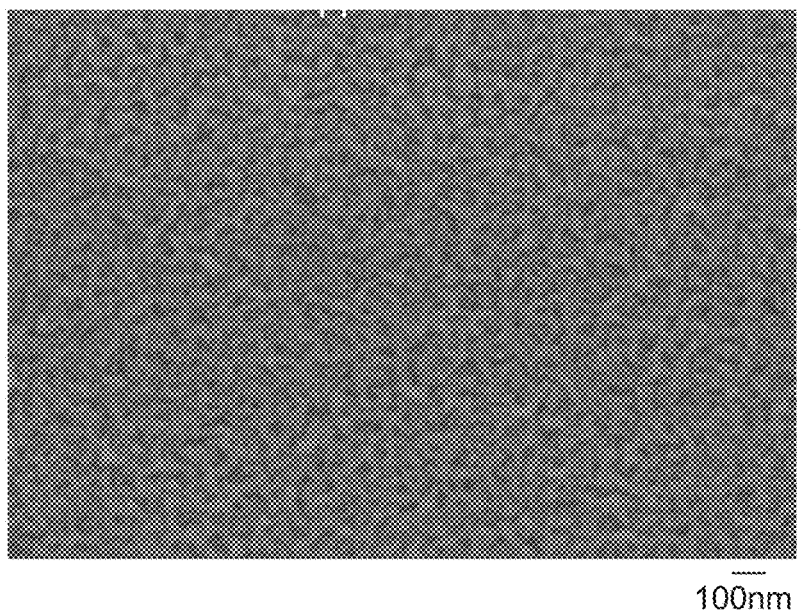
FIG. 13 is a is a top view of view SEM micrograph of resulting clean inorganic AR nanostructure on sapphire of Example 5.

After lamination, the PET support was separated from the laminated layers, leaving the backfill, SR540, co-PMMA, and IOA/AA layers adhered to the sapphire substrate. The sample was placed in a box furnace (Lindberg Blue M box furnace model BF51732PC-1, Asheville N.C., USA) and brought from 25° C. to 300° C. at a rate of approximately 10° C./min. The furnace was held at 300° C. for thirty minutes, then heated to 500° C. at a rate of approximately 10° C./min and held for one hour to decompose the IOA/AA, PMMA copolymer and the SR540. The furnace and sample were then to cool down to ambient temperature. The resulting clean inorganic nanostructure on sapphire is shown in FIG. 13.

Measurement of Average Reflectance at Near Normal Incidence

The average % reflection average corrected % reflection were measured as described in Example 1. The results of the average % reflection and average corrected % reflection are shown in Table 7.

TABLE 7

Average % reflection and average corrected % reflection for the unstructured SR540 AR on Sapphire.

| Sample | Average % Reflection | Average Corrected % Reflection |
|---|---|---|
| SR 540 27 Sapphire AR | 6.62 | 5.25 |

Example 6-600 nm Structured SR540 AR

Structured Template

The substrate used was a primed 0.002 inch (0.051 mm) thick PET. The replicating resin was a 75/25 blend of SR 399 and SR238 (both available from Sartomer USA, Exton, Pa.) with a photoinitiator package comprising 1% Darocur 1173 (Available from Ciba, Tarrytown, N.Y.), 1.9% triethanolamine (available from Sigma-Aldrich, St. Louis, Mo.), and 0.5% OMAN071 (available from Gelest, Inc. Morrisville, Pa.). Replication of the resin was conducted at 20 ft/min (6.1 m/min) with the replication tool temperature at 137 deg F. (58 deg C.). Radiation from a Fusion "D" lamp operating at 600 W/in was transmitted through the film to cure the resin while in contact with the tool. The replication tool was patterned with a 600 nm pitch linear sawtooth groove.

The replicated template film was primed in a plasma chamber using argon gas at a flow rate of 250 standard cc/min (SCCM), and a pressure of 25 mTorr and RF power of 1000 Watts for 30 seconds. Subsequently, a release coated tool surface was prepared by subjecting the samples to a tetramethylsilane (TMS) plasma at a TMS flow rate of 150 SCCM but no added oxygen, which corresponded to an atomic ratio of oxygen to silicon of about 0. The pressure in the plasma chamber was 25 mTorr, and the RF power of 1000 Watts was used for 10 seconds.

The substrate film was a 2 mil unprimed PET film coated with 8 micron thick PMMA copolymer (75 wt. % polymethylmethacrylate, 25 wt. % polyethyl acrylate, "PRD510-A", Altuglas Inc.) using a roll-to-roll web coating process. The replicating resin was ethoxylated bisphenol A dimethacrylate (SR540, available from Sartomer Company, Exton, Pa.) with a photoinitiator package comprising 0.5% Darocur 1173 and 0.1% TPO.

Structured sacrificial films were prepared by coating the substrate film, at a web speed of 10 ft/min (about 3 meters/min.), and the coated web was pressed against the release coated, replicated template film using a nip heated to 90° F. (43° C.) and a pressure of 30 psi. The structured resin was then cured using two banks of FUSION high intensity UV D-bulb lamps (obtained from Fusion Systems, Rockville, Md.), one set at 600 watt/2.5 cm (100% power setting), and the other set at 360 watt/2.5 cm (60% power setting). The cured, structured resin was then separated from the polymer tool and wound into a roll. The resulting structured film had prisms of 540 nm height with a periodicity of 600 nm.

Sputtered-Etch AR Coatings

The samples are sputter etched with the conditions shown for Sample D in Table 8.

TABLE 8

Process conditions for sputter etch Sample D.

| Sample | TMS Flow Sccm | O$_2$ Flow sccm | Pressure mTorr | Power watts | Speed Feet/min |
|---|---|---|---|---|---|
| Sample D | 20 | 500 | 6 | 6000 | 2.43 |

Backfill Coating

A section of the sputter etch film was attached to a 2 in×3 in microscope slide with tape. PermaNew 6000 (available from California Hardcoating Company, Chula Vista, Calif.) was diluted to 15% w/w in 80:20 IPA/butanol, brought to room temperature, and filtered through a 1.0 um filter. The sample of the treated film was coated with the PermaNew solution, which was applied to the film sample by spin coating on a Cee 200X Precision spin coater (Brewer Science, Inc. Rolla, Mo.). The spin parameters are 500 rpm for 3 sec (solution application), and 2000 rpm for 30 sec, then 500 rpm for 10 seconds. Approximately 5 milliliters of the PermaNew solution was applied to the replicated film during the solution application step of the spin cycle. The coated sample was placed in an oven at 80° C. for four hours to cure the PermaNew coating, then cooled to room temperature.

Sacrificial Adhesive Layer Coating

Glass slides, 2 in×3 in, were cleaned with IPA and a lint free cloth. A slide was mounted on the vacuum chuck of a spin coater. The spin coater was programmed for 500 RPM for 5 seconds (coating application step) then 1500 RPM for 10 sec (spin step), then 500 RPM for 60 seconds (dry step).

A solution of IOA/AA Optically Clear Adhesive (90% isooctylacrylate, 10% acrylic acid, as described in US reexam patent 24,906 (Ulrich) was diluted to 5 wt % in 66:33 ethyl acetate/heptane. Approximately 1-2 mL of the IOA/AA solution was applied to the glass slide during the coating application portion of the spin cycle. The slide was then removed from the spin coater and allowed to dry.

Lamination

The film was laminated at 180° F., PermaNew coating side down, to the IOA/AA coated glass slide using a thermal film laminator (GBC Catena 35, GBC Document Finishing, Lincolnshire, Ill.). The laminated sample was removed from the laminator and allowed cool to room temperature.

Bake-Out

Figure 14A:
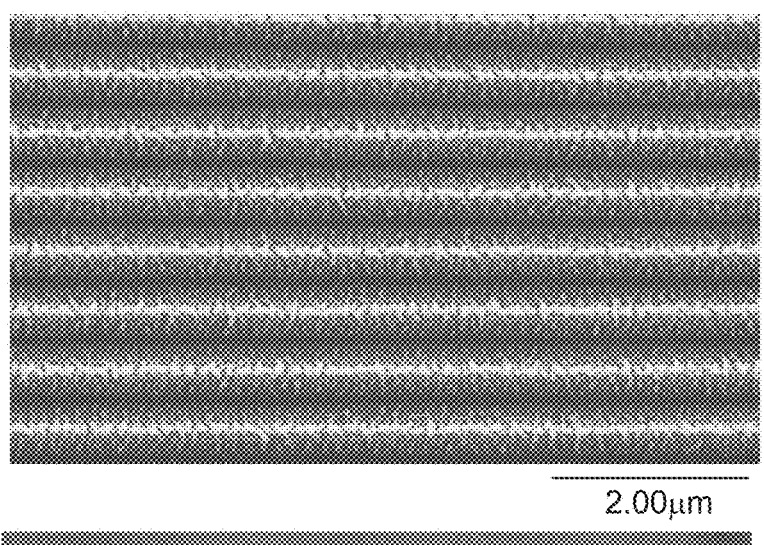
FIG. 14A is a top view SEM micrograph of the resulting inorganic hierarchical AR nanostructure of Example 6.
Figure 14B:
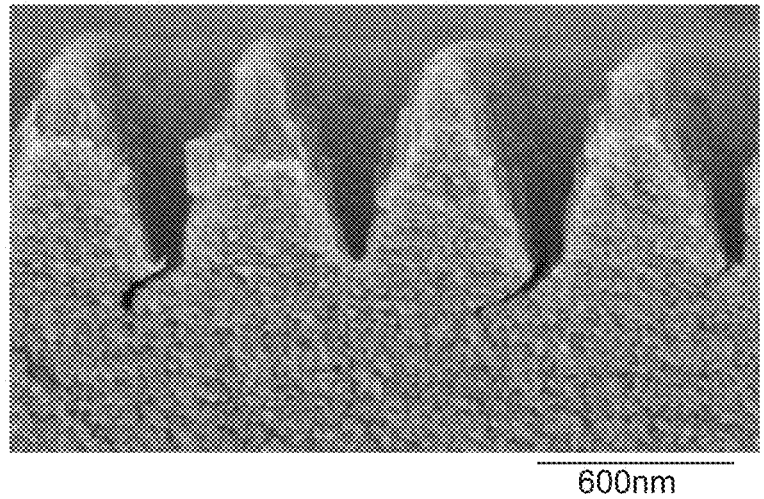
FIG. 14B is a side view SEM micrograph of the resulting inorganic hierarchical AR nanostructure of Example 6.

After lamination, the PET support was separated from the laminated layers, leaving the Perma-New, SR540, co-PMMA, and IOA/AA layers adhered to the glass slide. The sample was placed in a box furnace (Lindberg Blue M box furnace model BF51732PC-1, Asheville N.C., USA) and brought from 25° C. to 300° C. at a rate of approximately 10° C./min. The furnace was held at 300° C. for thirty minutes, then heated to 500° C. at a rate of approximately 10° C./min and held for one hour to decompose the IOA/AA, PMMA copolymer and the SR540. The furnace and sample were then to cool down to ambient temperature. The resulting clean inorganic nanostructure is shown in FIG. 14A (top view) and FIG. 14B (side view).

Example 7—3 Micrometer Structured SR540 AR

Structured Template

The substrate used was a primed 0.002 inch (0.051 mm) thick PET. The replicating resin was a 75/25 blend of SR 399 and SR238 (both available from Sartomer USA, Exton, Pa.) with a photoinitiator package comprising 1% Darocur 1173 (Available from Ciba, Tarrytown, N.Y.), 1.9% triethanolamine (available from Sigma-Aldrich, St. Louis, Mo.), and 0.5% OMAN071 (available from Gelest, Inc. Morrisville, Pa.). Replication of the resin was conducted at 20 ft/min (6.1 m/min) with the replication tool temperature at 137 deg F. (58 deg C.). Radiation from a Fusion "D" lamp operating at 600 W/in was transmitted through the film to cure the resin while in contact with the tool. The replication tool was patterned with a 3 micron pitch linear sawtooth groove.

The replicated template film was primed in a plasma chamber using argon gas at a flow rate of 250 standard cc/min (SCCM), a pressure of 25 mTorr and RF power of 1000 Watts for 30 seconds. Subsequently, a release coated tool surface was prepared by subjecting the samples to a tetramethylsilane (TMS) plasma at a TMS flow rate of 150 SCCM but no added oxygen, which corresponded to an atomic ratio of oxygen to silicon of about 0. The pressure in the plasma chamber was 25 mTorr, and the RF power of 1000 Watts was used for 10 seconds.

Sacrificial Template Coating

The substrate film was a 2 mil unprimed PET film coated with 8 micron thick PMMA copolymer (75 wt. % polymethylmethacrylate, 25 wt. % polyethyl acrylate, "PRD510-A", Altuglas Inc.) using a roll-to-roll web coating process. The replicating resin was ethoxylated bisphenol A dimethacrylate (SR540, available from Sartomer Company, Exton, Pa.) with a photoinitiator package comprising 0.5% Darocur 1173 and 0.1% TPO. The resin was coated between the base film and a tool film in a nip with a fixed gap of 0 mil. The laminate was cured with radiation from a Fusion "D" lamp operating at 600 W/in as transmitted through the film to cure the resin while in contact with the tool. The tool film was then removed from the sample, resulting in a structured resin coating on PET.

Sputtered-Etch AR Coatings

The samples are sputter etched with the conditions shown for Sample E in Table 9.

TABLE 9

Process conditions for sputter etch Sample E.

| Sample | TMS Flow Sccm | O$_2$ Flow sccm | Pressure mTorr | Power watts | Speed Feet/min |
|---|---|---|---|---|---|
| Sample E | 20 | 500 | 6 | 6000 | 2.43 |

Backfill Coating

A section of the sputter etch film was attached to a 2 in×3 in microscope slide with tape. PermaNew 6000 (available from California Hardcoating Company, Chula Vista, Calif.) was diluted to 15% w/w in 80:20 IPA/butanol, brought to room temperature, and filtered through a 1.0 um filter. The sample of the treated film was coated with the PermaNew solution, which was applied to the film sample by spin coating on a Cee 200X Precision spin coater (Brewer Science, Inc. Rolla, Mo.). The spin parameters were 500 rpm for 3 sec (solution application), and 2000 rpm for 30 sec, then 500 rpm for 10 seconds. Approximately 5 milliliters of the PermaNew solution was applied to the replicated film during the solution application step of the spin cycle. The coated sample was placed in an oven at 80° C. for four hours to cure the PermaNew coating, then cooled to room temperature.

Sacrificial Adhesive Layer Coating

Glass slides, 2 in×3 in, were cleaned with IPA and a lint free cloth. A slide was mounted on the vacuum chuck of a spin coater. The spin coater was programmed for 500 RPM for 5 seconds (coating application step) then 1500 RPM for 10 sec (spin step), then 500 RPM for 60 seconds (dry step).

A solution of IOA/AA Optically Clear Adhesive (90% isooctylacrylate, 10% acrylic acid, as described in US reexam patent 24,906 (Ulrich) was diluted to 5 wt % in 66:33 ethyl acetate/heptane. Approximately 1-2 mL of the IOA/AA solution was applied to the glass slide during the coating application portion of the spin cycle. The slide was then removed from the spin coater and allowed to dry.

Lamination

The film was laminated at 180° F. (PermaNew coating side toward the sacrificial adhesive layer) to the IOA/AA coated glass slide using a thermal film laminator (GBC Catena 35, GBC Document Finishing, Lincolnshire, Ill.). The laminated sample was removed from the laminator and allowed cool to room temperature.

Bake-Out

Figure 15A:
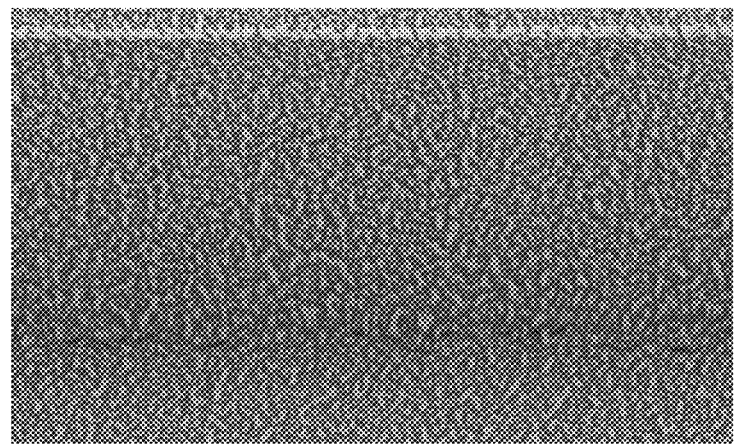
FIG. 15A is a top view SEM micrograph of the resulting inorganic hierarchical AR nanostructure of Example 7.
Figure 15B:
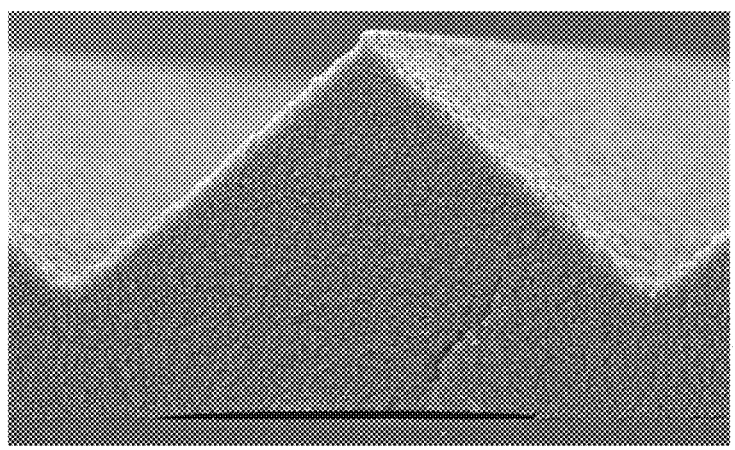
FIG. 15B is a side view SEM micrograph of the resulting inorganic hierarchical AR nanostructure of Example 7.
Figure 15C:
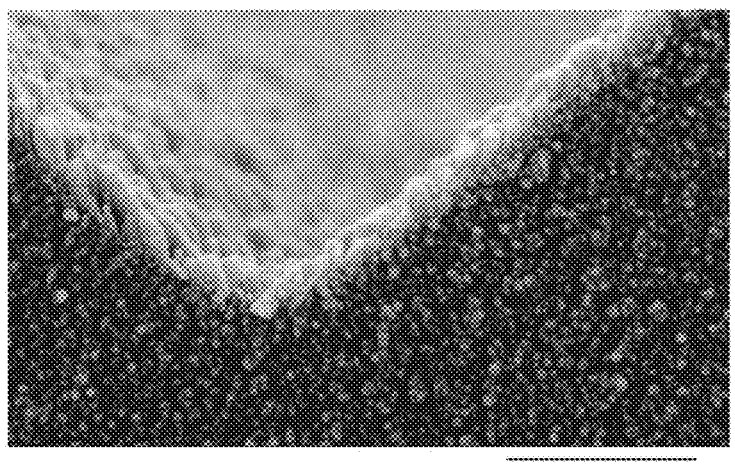
FIG. 15C is a magnified side view SEM micrograph of the resulting inorganic hierarchical AR nanostructure of Example 7.

After lamination, the PET support was separated from the laminated layers, leaving the Perma-New, SR540, co-PMMA, and IOA/AA layers adhered to the glass slide. The sample was placed in a box furnace (Lindberg Blue M box furnace model BF51732PC-1, Asheville N.C., USA) and brought from 25° C. to 300° C. at a rate of approximately 10° C./min. The furnace was held at 300° C. for thirty minutes, then heated to 500° C. at a rate of approximately 10° C./min and held for one hour to decompose the IOA/AA, PMMA copolymer and the SR540. The furnace and sample were then to cool down to ambient temperature. The resulting clean inorganic nanostructure is shown in FIG. 15A (top view) and FIG. 15B (side view) and FIG. 15C (magnified side view).

Thus, embodiments of LAMINATION TRANSFER FILMS FOR FORMING ARTICLES WITH ANTIREFLECTIVE STRUCTURES are disclosed.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A method, comprising:
    laminating a planar surface of a transfer film onto a receptor substrate, the transfer film comprising:
        a carrier film;
        a sacrificial template layer disposed on the carrier film and comprising nanostructure template features, each nanostructure template feature comprising a portion of a discontinuous masking layer and having a longest dimension of 1 nm to 2000 nm and a height to width ratio of 5:1 to 200:1 and formed by reactive ion etching; and
        a thermally stable backfill layer having a structured surface opposite of the planar surface, the structured surface conforming to the nanostructure template features; and
    baking out the sacrificial template layer to form a thermally stable backfill layer having nanostructure features, wherein the portion of a discontinuous masking layer remains in each nanostructure feature.

2. The method according to claim 1, further comprising removing the carrier film from the sacrificial template layer before the baking out step.

3. The method according to claim 1, wherein the nanostructure features of the thermally stable backfill layer are disposed on microstructure features of the thermally stable backfill layer.

4. The method according to claim 1, wherein the receptor substrate is glass.

5. The method according to claim 1, wherein the receptor substrate is sapphire.

6. The method according to claim 1, wherein the nanostructure features of the thermally stable backfill layer are antireflective nanostructure features.

7. The method according to claim 1, wherein the nanostructure features of the thermally stable backfill are quasi-periodic, engineered, antireflective nanostructure template features.

8. The method according to claim 1, wherein the thermally stable backfill layer comprises polysiloxane, polysilazane, polyimide, silsesquioxane, or a combination thereof.

9. The method according to claim 1, wherein the thermally stable backfill layer comprises polysiloxane.

10. The method according to claim 1, wherein the thermally stable backfill layer exhibits an average reflectance of between about 0.7% and about 7% when measured at a 10° incidence angle.

11. The method according to claim 1, wherein the nanostructure features of the thermally stable backfill layer are random, engineered, antireflective nanostructure features.

12. The method according to claim 1, wherein the discontinuous masking layer is applied by a sputtering technique.

13. The method according to claim 12, wherein the reactive ion etching is performed simultaneously with the sputtering of the discontinuous masking layer.

* * * * *